US010937826B2

(12) United States Patent
Liu et al.

(10) Patent No.: US 10,937,826 B2
(45) Date of Patent: Mar. 2, 2021

(54) MICRO SEMICONDUCTOR STRUCTURE

(71) Applicant: PlayNitride Display Co., Ltd., Miaoli County (TW)

(72) Inventors: Ying-Tsang Liu, Zhunan Township, Miaoli County (TW); Pei-Hsin Chen, Zhunan Township Miaoli County (TW); Yi-Chun Shih, Zhunan Township, Miaoli County (TW); Yi-Ching Chen, Zhunan Township, Miaoli County (TW); Yu-Chu Li, Miaoli County (TW); Huan-Pu Chang, Zhunan Township, Miaoli County (TW); Tzu-Yang Lin, Zhunan Township, Miaoli County (TW); Yu-Hung Lai, Zhunan Township, Miaoli County (TW)

(73) Assignee: PLAYNITIRIDE DISPLAY CO., LTD., Miaoli County (TW)

( * ) Notice: Subject to any disclaimer, the term of this patent is extended or adjusted under 35 U.S.C. 154(b) by 0 days.

(21) Appl. No.: 16/436,333

(22) Filed: Jun. 10, 2019

(65) Prior Publication Data
US 2020/0176509 A1  Jun. 4, 2020

(30) Foreign Application Priority Data
Dec. 4, 2018  (TW) .............................. 107143456 A

(51) Int. Cl.
*H01L 27/15* (2006.01)
*H01L 33/36* (2010.01)

(52) U.S. Cl.
CPC ............ *H01L 27/156* (2013.01); *H01L 33/36* (2013.01)

(58) Field of Classification Search
CPC ..... H01L 27/156; H01L 33/36; H01L 33/382; H01L 33/44; H01L 25/0753; H01L 33/486; H01L 2933/0033; H01L 33/12
See application file for complete search history.

(56) References Cited

U.S. PATENT DOCUMENTS

| 8,789,573 B2* | 7/2014 | Bibl ................... H01L 21/67144 156/540 |
| 9,768,345 B2* | 9/2017 | Hu ......................... H01L 33/405 |
| 10,297,722 B2* | 5/2019 | Chang ..................... H01L 33/20 |
| 2010/0078670 A1* | 4/2010 | Kim .......................... H01L 33/46 257/98 |
| 2011/0297914 A1* | 12/2011 | Zheng ..................... H01L 33/46 257/13 |
| 2013/0130440 A1* | 5/2013 | Hu ....................... H01L 33/0093 438/107 |
| 2013/0285086 A1* | 10/2013 | Hu ........................... H01L 24/95 257/98 |
| 2019/0189496 A1* | 6/2019 | Chen ...................... B65G 47/90 |
| 2020/0321489 A1* | 10/2020 | Wang ................. H01L 21/68714 |

* cited by examiner

*Primary Examiner* — Edward Chin
(74) *Attorney, Agent, or Firm* — Birch, Stewart, Kolasch & Birch, LLP

(57) ABSTRACT

A micro semiconductor structure is provided. The micro semiconductor structure includes a substrate, at least one supporting layer, and at least one micro semiconductor device. The supporting layer includes at least one upper portion and a bottom portion, wherein the upper portion extends in a first direction. The length L1 of the upper portion in the first direction is greater than the length L2 of the bottom portion in the first direction. Furthermore, the bottom surface of the micro semiconductor device is in direct contact with the upper portion of the supporting layer.

17 Claims, 16 Drawing Sheets

MICRO SEMICONDUCTOR STRUCTURE

CROSS REFERENCE TO RELATED APPLICATIONS

This application claims priority of Taiwan Patent Application No. 107143456, filed on Dec. 4, 2018, the entirety of which is incorporated by reference herein.

BACKGROUND

Field of the Disclosure

The present disclosure relates to a semiconductor structure, and in particular to a micro semiconductor structure.

Description of the Related Art

With the advancements being made in the field of optoelectronic technology, the size of optoelectronic components has gradually evolved toward miniaturization. In recent years, due to breakthroughs in the size of light-emitting diodes (LEDs), the micro light-emitting diodes (micro LED) displays in which arrays of light-emitting diodes are arranged in an array have increasingly interested people in the field. A micro LED display is an active micro semiconductor device display, and it is more energy efficient than organic light-emitting diodes (OLED) displays. Furthermore, a micro LED display has better contrast performance than an OLED display, and it is visible under in sunlight. In addition, since micro LED displays use inorganic material, they have better reliability and a longer lifetime than OLED displays.

Micro devices (such as micro light-emitting diodes) may be fixed on a temporary carrier by means of a supporting structure, thereby facilitating the transfer of the micro devices from the temporary carrier to a receiving substrate. In general, the supporting structure is disposed on both sides of the micro devices. Therefore, the micro devices could not be densely arranged on the temporary carrier, resulting in a reduction in the integration density of the micro devices. In addition, a novel structure is needed for easily and efficiently transporting and transferring the micro devices between the temporary carrier and the receiving substrate.

BRIEF SUMMARY

The disclosure provides a micro semiconductor structure. In some embodiments, the micro semiconductor structure can include a substrate, at least one supporting layer, and at least one micro semiconductor device. The supporting layer is disposed on the top surface of the substrate, wherein supporting layer consists of at least one upper portion and a bottom portion, and wherein the upper portion extends in a first direction. The length L1 of the upper portion in the first direction is longer than the length L2 of the bottom portion in the first direction. In addition, the bottom surface of the micro semiconductor device is in direct contact with the upper portion of the supporting layer. The micro semiconductor device has a first electrode and a second electrode, wherein the first electrode and the second electrode are disposed on the same surface (such as the bottom surface) of the micro semiconductor device, or the first electrode is disposed on the bottom surface of the micro semiconductor device and the second electrode is disposed on the top surface of the micro semiconductor device.

According to embodiments of the disclosure, the ratio of the length L2 of the bottom portion of the supporting layer in the first direction to the length L1 of the upper portion of the supporting layer in the first direction is greater than or equal to about 0.05 and less than or equal to about 0.5.

According to embodiments of the disclosure, the bottom surface of the micro semiconductor device has at least one first region which is an interface between the bottom surface of the micro semiconductor device and the upper portion. Namely, the first region is the part of the bottom surface of the micro semiconductor device which is in direct contact with the upper portion of the supporting layer. The ratio (A1/A2) of the surface area A1 of the first region to the surface area A2 of the bottom surface of the micro semiconductor device is greater than or equal to about 0.05 and less than or equal to 0.5, such as from about 0.05 to 0.5, from about 0.05 to 0.3, from about 0.1 to 0.3, or from about 0.2 to 0.5.

According to some embodiments of the disclosure, the bottom surface of the micro semiconductor device has at least two first regions, wherein the first regions are spaced apart from each other.

According to embodiments of the disclosure, the first region has a length L3 in the first direction. There is a minimum distance D1 between the first region and the bottom portion of the supporting layer in the first direction. In particular, the ratio (L3/(L3+D1)) of the length L3 of the first region in the first direction to the sum of the length L3 of the first region in the first direction and the minimum distance D1(L3+D1) is greater than or equal to about 0.2 and less than or equal to about 0.8.

According to some embodiments of the disclosure, the length L3 is less than or equal to about 5 μm, such as from about 0.5 μm to 5 μm, from about 1 μm to 5 μm, or from about 1 μm to 3 μm. The minimum distance D1 is less than or equal to about 25 μm, such as from about 0.5 μm to 5 μm, from about 5 μm to 25 μm, or from about 10 μm to 15 μm.

According to embodiments of the disclosure, the bottom surface of the micro semiconductor device has at least two first regions, wherein the first regions are spaced apart from each other.

According to embodiments of the disclosure, the first electrode has a thickness T1, the second electrode has a thickness T2, and the upper portion of the supporting layer has a thickness T3, wherein the thickness T1 of the first electrode is greater than the thickness T3 of the upper portion of the supporting layer.

According to some embodiments of the disclosure, when the second electrode is disposed on the bottom surface of the micro semiconductor device, the thickness T2 of the second electrode is greater than the thickness T3 of the upper portion of the supporting layer.

According to embodiments of the disclosure, the bottom portion of the supporting layer has a thickness T4, and the sum of the thickness T3 of the upper portion and the thickness T4 of the bottom portion is greater than the thickness T1 of the first electrode.

According to some embodiments of the disclosure, the sum of the thickness T3 of the upper portion and the thickness T4 of the bottom portion is greater than the thickness T2 of the second electrode, when the second electrode is disposed on the bottom surface of the micro semiconductor device.

According to embodiments of the disclosure, the upper portion of the supporting layer is made of a first material, and the bottom portion of the supporting layer is made of a second material. According to other embodiments of the disclosure, the first material is distinct from the second material, and the Young's modulus of the first material is less than the Young's modulus of the second material.

According to embodiments of the disclosure, an orthogonal projection of the bottom surface of the micro semiconductor device onto the substrate does not overlap an orthogonal projection of the bottom portion of the supporting layer onto the substrate.

According to embodiments of the disclosure, the first electrode and the second electrode do not come into direct contact with the supporting layer.

According to embodiments of the disclosure, the micro semiconductor device has a surrounding surface joining the top surface of the micro semiconductor device and the bottom surface of the micro semiconductor device, and wherein the supporting layer does not contact the top surface of the micro semiconductor device or the surrounding surface of the micro semiconductor device.

According to embodiments of the disclosure, the bottom surface of the micro semiconductor device has a second region disposed between the first electrode and the second electrode, and the second region does not directly contact the supporting layer, when the first electrode and the second electrode are disposed on the bottom surface of the micro semiconductor device.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION

Figure 1:
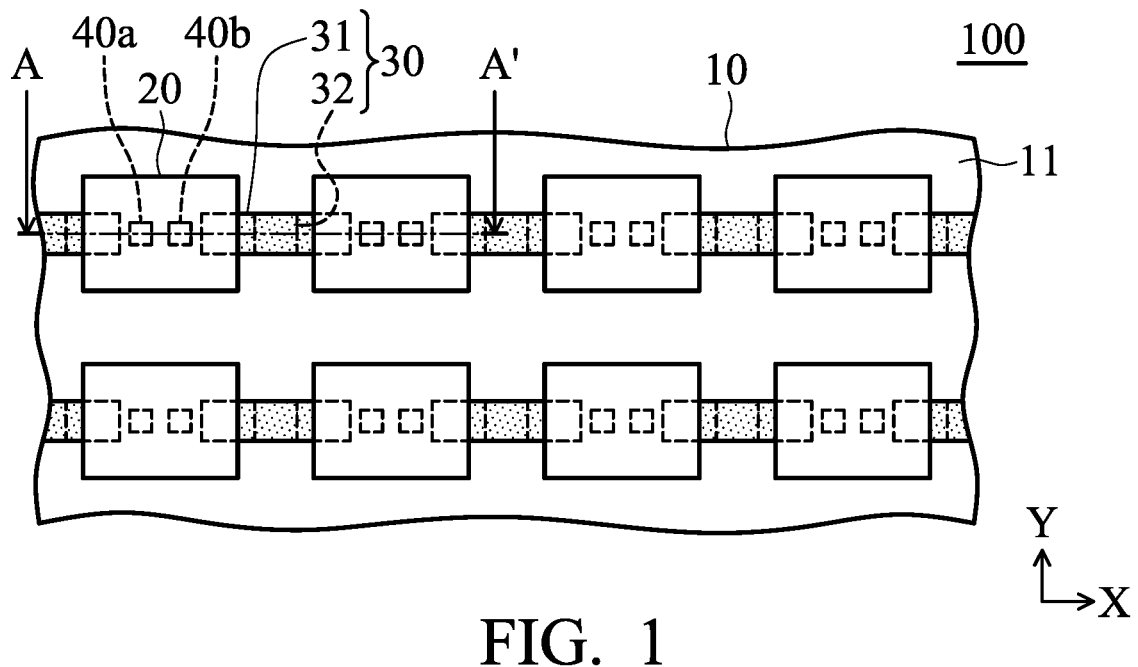
FIG. 1 is a top view of a micro semiconductor structure in accordance with one embodiment of the disclosure.

The micro semiconductor device of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that is in direct contact with the other layer, and they may also refer to a layer hat does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The disclosure provides a micro semiconductor structure having micro semiconductor devices. The micro semiconductor devices (such as a micro LED or micro chip) are fixed on a substrate (such as a temporary carrier). The micro semiconductor devices are spaced apart from each other by a predetermined distance. As a result, the specific micro semiconductor structure can prevent the micro semiconductor devices from being damaged during the subsequent transferring process.

In addition, the micro semiconductor devices of the micro semiconductor structure of the disclosure can be transferred easily from a temporary carrier to a receiving substrate. It should be noted that, in the micro semiconductor structure of the disclosure, the supporting layer is disposed on the bottom surface of the micro semiconductor device rather than sidewalls of the micro semiconductor device. As a result, the amount of the micro semiconductor devices disposed on the temporary carrier can be increased on the premise that the success rate of the process for transporting and transferring the micro semiconductor devices is not reduced.

The "micro" semiconductor device of the disclosure means a semiconductor device which has a length, width and height within a range of 1 μm to 100 μm. According to embodiments of the disclosure, the micro semiconductor device may have a maximum width of 20 μm, 10 μm, or 5 μm. In some embodiments, the micro semiconductor device 20 may have a maximum height of 10 μm or 5 μm. However, it should be understood that embodiments of the present invention are not limited thereto, and aspects of certain embodiments may be applied to larger and perhaps smaller scales.

According to embodiments of the disclosure, the receiving substrate may be, for example, a display substrate, a light-emitting substrate, a substrate having a functional element (such as a thin film transistor or an integrated circuit), or other types of circuit substrates, but the receiving substrate is not limited to the above-mentioned type. Although some embodiments of the disclosure specifically describe a micro semiconductor device including a p-n diode, it should be understood that embodiments of the disclosure are not limited to these embodiments, and certain embodiments may be applied to another micro semiconductor devices, including a micro semiconductor device (for example, a diode, a transistor, or an integrated circuit) which can be controlled to perform predetermined electronic functions or a micro semiconductor device 20 (for example, a light-emitting diode, a laser diode, or a photodiode) which can be controlled to perform predetermined opto-electronic functions. Other embodiments of the invention may also be applied to microchips including circuits, such as microchips using silicon or semiconductor-on-insulator (SOI) wafers as the material and used in logic or memory applications or microchips using gallium arsenide (GaAs) wafers as a material and used in RF communication applications.

Figure 2:
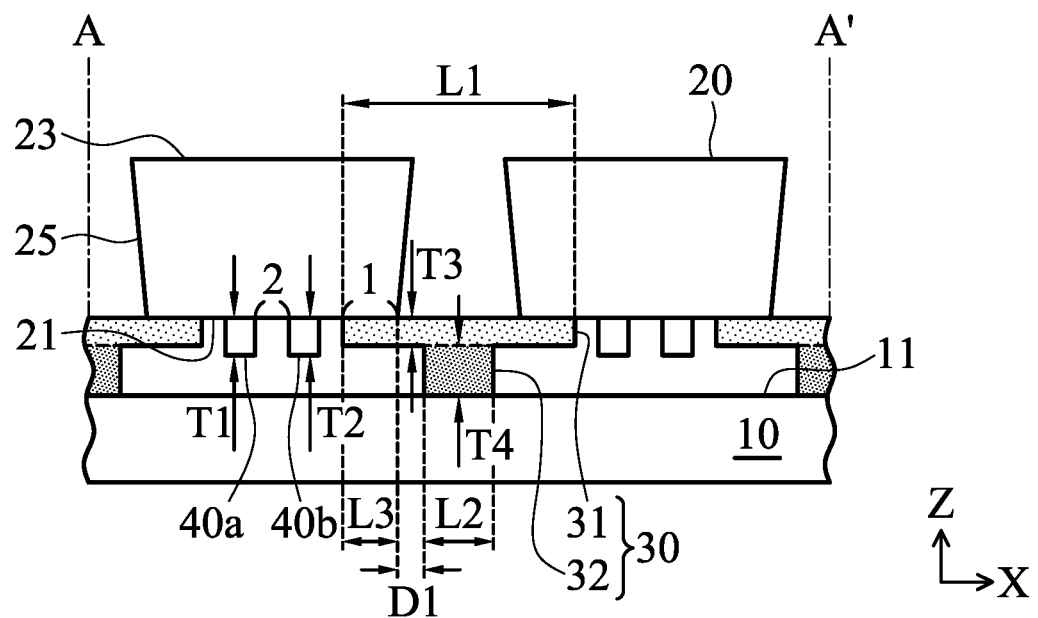
FIG. 2 is a cross-sectional view of the micro semiconductor structure taken along line A-A' of FIG. 1.

FIG. 1 is a top view of a micro semiconductor structure 100 in accordance with one embodiment of the disclosure, and FIG. 2 is a cross-sectional view of the micro semiconductor structure 100 taken along line A-A' of FIG. 1. As shown in FIG. 1, the micro semiconductor structure 100 of the disclosure can include a substrate 10, the micro semiconductor devices 20, and a supporting layer 30. According to embodiments of the disclosure, the substrate 10, for example, can be a temporary carrier for carrying the micro semiconductor devices 20 and the supporting layers 30. The substrate 10, for example, can be a plastic substrate, a glass substrate, a sapphire substrate, or another substrate having no circuits.

As shown in FIG. 1, the supporting layer 30 is disposed on the top surface 11 of the substrate 10, and the supporting layer 30 is formed between the substrate 10 and the micro semiconductor device 20. The supporting layer 30 can consist of the upper portion 31 and the bottom portion 32. The upper portion 31 of the supporting layer 30 can be made of a first material and the bottom portion 32 of the supporting layer 30 can be made of a second material. The first material and second material can be independently organic material (such as benzocyclobutene, phenol formaldehyde resin, epoxy resin, polyisoprene rubber or a combination thereof), inorganic material (such as silicon oxide, silicon nitride, silicon oxynitride, or a combination thereof), other thermal denatured material (such as cold-short material, hot melting material, photoresist material, or a combination thereof), or a combination thereof. The upper portion 31 of the supporting layer 30 extends in a first direction, and the upper portion 31 is in direct contact with the micro semiconductor device 20 in order to support and hold the micro semiconductor device 20. The bottom portion 32 of the supporting layer 30 is in direct contact with the top surface 11 of the substrate 10 in order to support the upper portion 31. In addition, an orthogonal projection of the bottom surface 21 of the micro semiconductor device 20 onto the substrate 10 does not overlap an orthogonal projection of the bottom portion 32 of the supporting layer 30 onto the substrate 10. According to embodiments of the disclosure, orthogonal projections of the two adjacent upper portions 31 of the supporting layer 30 onto the substrate 10 are spaced apart from each other. Therefore, the upper portion 31 of the supporting layer 30 is discontinuous.

As shown in FIG. 2, the upper portion 31 of the supporting layer 30 has a length (such as the maximum length) L1 in the first direction X, and the bottom portion 32 of the supporting layer 30 has a length (such as the maximum length) L2 in the first direction X, wherein the length L1 of the upper portion 31 in the first direction X is greater than the length L2 of the bottom portion 32 in the first direction X. According to embodiments of the disclosure, the ratio (L2/L1) of the length L2 of the bottom portion 32 in the first direction X to the length L1 of the upper portion 31 in the first direction X is greater than or equal to about 0.05 and less than or equal to 0.5, such as from about 0.05 to 0.5, from about 0.05 to 0.3, from about 0.1 to 0.3, or from about 0.2 to 0.5. It should be noted that, when the ratio (L2/L1) of the length L2 of the bottom portion 32 in the first direction X to the length L1 of the upper portion 31 in the first direction X is too large, the micro semiconductor device 20 is not apt to be transferred from the substrate 10 to a receiving substrate in subsequent processes. When the ratio (L2/L1) of the length L2 of the bottom portion 32 in the first direction X to the length L1 of the upper portion 31 in the first direction X is too small, the bottom portion 32 would not be able to support the upper portion 31. According to embodiments of the disclosure, as shown in FIGS. 1 and 2, the projection of the upper portion 31 and the bottom portion 32 of the supporting layer 30 in a second direction Y is T-shaped which has a greater upper width and a smaller bottom width (i.e. the profile of the supporting layer 30 in the first direction X is T-shaped), wherein the first direction X is orthogonal to the second direction Y, and the first direction X and the second direction Y are parallel to the top surface 11 of the substrate 10. The term "orthogonal to" refers to an angle between the first direction and the second direction within the range of 90±5 degrees.

According to embodiments of the disclosure, the first material of the upper portion 31 and the second material of the bottom portion 32 are the same. For example, the upper portion 31 of the supporting layer 30 and the bottom portion 32 of the supporting layer 30 can be seamless. According to some embodiments of the disclosure, the first material of the upper portion 31 is distinct from the second material of the bottom portion 32. Namely, the upper portion 31 of the supporting layer 30 and the bottom portion 32 of the supporting layer 30 are made of different materials by different processes. According to embodiments of the disclosure, the Young's modulus of the first material (the upper portion 31) is less than the Young's modulus of the second material (the bottom portion 32). Therefore, the rigidity of the first material (the upper portion 31) is less than the rigidity of the second material (the bottom portion 32), and the toughness of the first material (the upper portion 31) is greater than the toughness of the second material (the bottom portion 32). For example, the first material (the upper portion 31) can be photoresist material or other thermal denatured material, and the second material (the bottom portion 32) can be inorganic material. When the upper portion 31 of the supporting layer 30 has a relatively high toughness, it can effectively provide a good buffering ability between the micro semiconductor device 20 and the bottom portion 32 of the supporting layer 30, thereby preventing the upper portion 31 of the supporting layer 30 from cracking due to the external force while fixing and supporting the micro semiconductor device 20. When the bottom portion 32 of the supporting layer 30 has a relatively high toughness, the bottom portion 32 can effectively support and hold the micro semiconductor device 20. As a result, since the supporting layer 30 of the disclosure can consist of materials which have various degrees of Young's modulus, toughness and rigidity, the supporting layer 30 can affix and support the micro semiconductor device 20 effectively and prevent the micro semiconductor device 20 from cracking, thereby facilitating the transfer of the micro semiconductor device 20 between different substrates. The Young's modulus of the material is determined according to ASTM D882-12, the rigidity of the material is determined according to ASTM D790, and toughness (fracture toughness) is determined according to ASTM D 5045.

According to embodiments of the disclosure, the supporting layer 30 can be formed and fixed onto the top surface 11 of the substrate 10. Next, the micro semiconductor device 20 is disposed on the supporting layer 30 over the substrate 10, and the micro semiconductor device 20 are supported and held by the upper portion 31 of the supporting layer 30. The bottom surface 21 of the micro semiconductor device 20 is in direct contact with the upper portion 31 of the supporting layer 30.

According to some embodiments of the disclosure, when the first material of the upper portion 31 and the second material of the bottom portion 32 are different, the first material can be formed and fixed on the bottom surface 21 of the micro semiconductor device 20, and the second material can be formed on the top surface 11 of the substrate 10. Next, the micro semiconductor device 20 (with the first material) is disposed on the substrate 10, resulting in the first material being in direct contact with the second material to constitute the supporting layer 30 (i.e. the upper portion 31 of the supporting layer 30 is made of the first material, and the bottom portion 32 of the supporting layer 30 is made of the second material), obtaining the micro semiconductor structure 100. As a result, the micro semiconductor device 20 is firmly fixed on the substrate 10 by means of the supporting layer 30.

According to embodiments of the disclosure, in the subsequent transferring process, the upper portion 31 of the supporting layer 30 can be partially or completely separated from the substrate 10. Namely, the upper portion 31 of the supporting layer 30 can be partially or completely transferred to the receiving substrate along with the micro semiconductor device 20.

According to some embodiments of the disclosure, in the subsequent transferring process, the whole upper portion 31 of the supporting layer 30 may remain on the substrate 10. Therefore, the upper portion 31 of the supporting layer 30 does not be transferred to the receiving substrate along with the micro semiconductor device 20. According to embodiments of the disclosure, the micro semiconductor device 20 (such as a micro light-emitting semiconductor device) can be transferred to a receiving substrate (such as a display substrate), thereby forming a semiconductor device (such as a Micro LED display).

As shown in FIG. 2, the micro semiconductor device 20 has a bottom surface 21, a top surface 23 and a surrounding surface 25 joining the bottom surface 21 of the micro semiconductor device 20 and the top surface 23 of the micro semiconductor device 20. The micro semiconductor device 20 can have a first electrode 40a and a second electrode 40b, wherein the first electrode 40a and the second electrode 40b have opposite electrical charges. In the embodiment of FIG. 1, the first electrode 40a and the second electrode 40b are disposed on the bottom surface 21 of the micro semiconductor device 20, and the first electrode 40a and the second electrode 40b are disposed on the bottom surface 21 of the micro semiconductor device 20 in the first direction X. The bottom surface 21 of the micro semiconductor device 20 is in direct contact with the upper portion 31 of the supporting layer 30.

According to embodiments of the disclosure, the orthogonal projections of the first electrode 40a and the second electrode 40b onto the substrate 10 do not overlap the orthogonal projection of the bottom portion 32 of the supporting layer 30 onto the substrate 10. According to embodiments of the disclosure, the orthogonal projections of the first electrode 40a and the second electrode 40b onto the substrate 10 do not overlap the orthogonal projection of the upper portion 31 of the supporting layer 30 onto the substrate 10. According to embodiments of the disclosure, the upper portion 31 of the supporting layer 30 does not is in direct contact with the first electrode 40a or the second electrode 40b, in order to prevent the first electrode 40a or the second electrode 40b from electrically connecting with the conductive circuits disposed on the receiving substrate. According to embodiments of the disclosure, the supporting layer 30 does not is in direct contact with the micro semiconductor device 20p surface 23. According to some embodiments of the disclosure, the supporting layer 30 does not is in direct contact with the surrounding surface 25 of the micro semiconductor device 20. Namely, the supporting layer 30 does not be disposed on the sidewalls of the micro semiconductor device 20. The supporting layer 30 is merely disposed on the bottom surface 21 of the micro semiconductor device 20. As a result, besides providing supporting and fixing effects, the supporting layer 30 of the disclosure facilitates a dense arrangement of the micro semiconductor devices 20 on the substrate 10 (increasing the amount of the micro semiconductor devices 20 disposed on the substrate 10), since the supporting layer 30 would not be disposed on the sidewalls of the micro semiconductor device 20 and the space adjacent to the sidewalls of the micro semiconductor device 20 would not be occupied.

Figure 3:
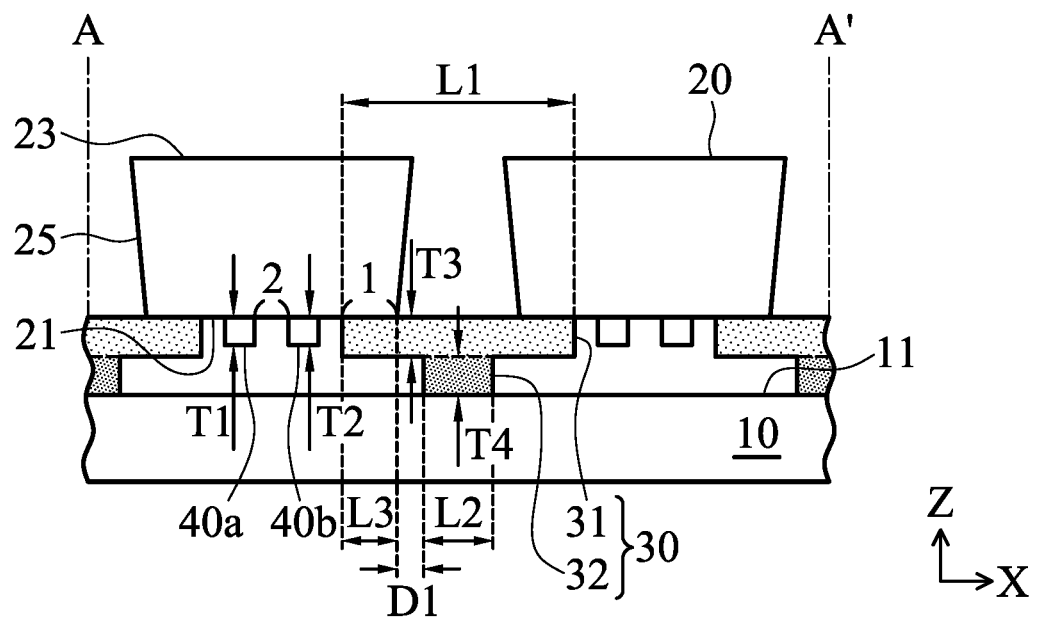
FIG. 3 is a cross-sectional view of the micro semiconductor structure in accordance with another embodiment of the disclosure.

As still shown in FIG. 2, the first electrode 40a has a thickness T1, the second electrode 40b has a thickness T2, the upper portion 31 of the supporting layer 30 has a thickness T3, and the bottom portion 32 of the supporting layer 30 has a thickness T4. The thickness T1 of the first electrode 40a is different from or the same as the thickness T2 of the second electrode 40b. Herein, the term "thickness of electrode" means the maximum distance between the electrode and the bottom surface 21 of the micro semiconductor device 20 in a third direction Z, wherein the third direction Z is orthogonal to the first direction X, and the third direction Z is perpendicular to the top surface 11 of the substrate 10. According to embodiments of the disclosure, the thickness T3 of the upper portion 31 of the supporting layer 30 is less than the thickness T1 of the first electrode 40a, and the thickness T3 of the upper portion 31 of the supporting layer 30 is also less than the thickness T2 of the first electrode 40b, as shown in FIG. 2. For example, the ratio (T3/T1) of the thickness T3 to the thickness T1 (or the ratio (T3/T2) of the thickness T3 to the thickness T2) can be from about 0.2 to 0.8. As a result, when the upper portion 31 of the supporting layer 30 is transferred to a receiving substrate along with the micro semiconductor device 20, the remaining upper portion 31 of the supporting layer 30 would not further disrupt the electrical connection between the micro semiconductor device 20 and conductive circuits disposed on the receiving substrate. According to some embodiments of the disclosure, when the material of the upper portion 31 of the supporting layer 30 (the first material) is organic material or other thermal denatured material (such as cold-short material, hot melting material, photoresist material, or a combination thereof), the thickness T3 of the upper portion 31 of the supporting layer 30 can be greater than or equal to the thickness T1 of the first electrode 40a, and the thickness T3 of the upper portion 31 of the supporting layer 30 can be greater than or equal to the thickness T2 of the first electrode 40b, as shown in FIG. 3. For example, the ratio (T3/T1) of the thickness T3 to the thickness T1 (or the ratio (T3/T2) of the thickness T3 to the thickness T2) can be from about 1 to 1.5. As a result, when transferring the micro semiconductor device 20 to the receiving substrate, the upper portion 31 of the supporting layer 30 can serve as a buffer layer since the material of the upper portion 31 of the supporting layer 30 is organic material or other thermal denatured material (such as cold-short material, hot melting material, photoresist material, or a combination thereof). After, the upper portion 31 of the supporting layer 30 can be removed by a heating or cooling treatment.

When the upper portion 31 of the supporting layer 30 is a cold-short material, the upper portion 31 can be removed by a cooling treatment. The temperature of the cooling treatment can be, for example, from about −100° C. to about 0° C. When the upper portion 31 of the supporting layer 30 is a hot melting material, the upper portion 31 can be removed by a heating treatment. The temperature of the heating treatment depends on the melting point of the hot melting material and can be, for example, from about 40° C. to 300° C., or from about 50° C. to 180° C. When the upper portion 31 of the supporting layer 30 is a photoresist material, the upper portion 31 can be removed by subjecting the upper portion 31 to a heating process, wherein the temperature of the heating treatment depends on the decomposition temperature of the photoresist material and can be, for example, from about 80° C. to 400° C. or from about 150° C. to 300° C.

According to embodiments of the disclosure, the sum of the thickness T3 of the upper portion 31 of the supporting layer 30 and the thickness T4 of the bottom portion 32 of the supporting layer 30 (i.e. the thickness of the supporting layer 30 (T3+T4)) is greater than the thickness T1 of the first electrode 40a, and the sum of the thickness T3 of the upper portion 31 of the supporting layer 30 and the thickness T4 of the bottom portion 32 of the supporting layer 30 is greater than the thickness T2 of the first electrode 40b. For example, the ratio of the thickness T1 (or T2) to the thickness (T3+T4) of the supporting layer 30 can be about 0.2 to 0.8. As a result, the supporting layer 30 can elevate the micro semiconductor device 20 to prevent the first electrode 40a and the second electrode 40b from directly contacting the substrate 10. Thus, the first electrode 40a and the second electrode 40b would not be damaged by the substrate 10. In addition, the micro semiconductor device 20 is apt to be picked or transferred easily, thereby facilitating the transfer of the micro semiconductor device 20 from the substrate 10 to the receiving substrate.

Figure 4:
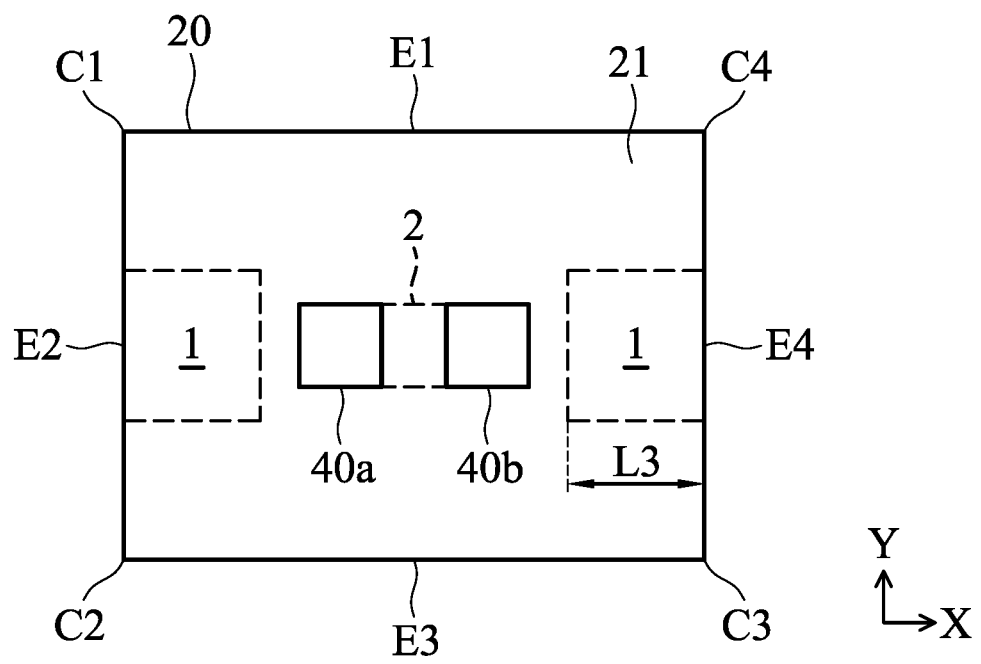
FIG. 4 is a bottom view of any one of the micro semiconductor devices of the micro semiconductor structure of FIG. 1.

FIG. 4 is a bottom view of any one of the micro semiconductor devices 20 of the micro semiconductor structure 100 of FIG. 1. The supporting layer 30 and the substrate 10 are not shown in FIG. 4 for convenience of illustration. As shown in FIGS. 2 and 4, the bottom surface 21 of the micro semiconductor device 20 has at least one first region 1 which is an interface between the bottom surface of the micro semiconductor device 20 and the upper portion 31 (i.e. the area of the bottom surface 21, which is in direct contact with to the upper portion 31, is defined as the first region 1). The first region 1 has a length L3 in the first direction X (i.e. the length of the upper portion 31, which is covered by the bottom surface 21 of the micro semiconductor device 20, in the first direction X), and there is a minimum distance D1 between the first region 1 and the bottom portion 32 of the supporting layer 30 in the first direction X (i.e. the distance from the micro semiconductor device 20 to the bottom portion 32 in the first direction X). According to embodiments of the disclosure, the ratio (L3/(L3+D1)) of the length of the first region in the first direction (L3) to the sum of the length of the first region in the first direction (L3) and the minimum distance (D1) is greater than or equal to about 0.2 and less than or equal to 0.8, such as from about 0.2 to 0.5, from about 0.5 to 0.8, or from about 0.2 to 0.8. As a result, the micro semiconductor device 20 can be fully supported and held by the upper portion 31 of the supporting layer 30 and the micro semiconductor device 20 is firmly fixed on the substrate 10 by means of the supporting layer 30. Therefore, the micro devices would be densely arranged on the substrate 10. According to embodiments of the disclosure, in order to avoid increasing the contact area (i.e. the first region) resulting in the subsequent transferring process being more difficult, the length L3 can be less than or equal to about 5 μm, such as from about 0.5 μm to 5 μm, from about 1 μm to 5 μm, or from about 1 μm to 3 μm, and the minimum distance D1 can be less than or equal to about 25 μm, such as from about 0.5 μm to 5 μm, from about 5 μm to 25 μm, or from about 10 μm to 15 μm.

As still shown in FIG. 4, according to embodiments of the disclosure, the ratio (A1/A2) of the surface area A1 of the first region 1 to the surface area A2 of the bottom surface 21 of the micro semiconductor device 20 is greater than or equal to about 0.05 and less than or equal to 0.5, such as from about 0.05 to 0.5, from about 0.1 to 0.5, from about 0.2 to 0.5, or from about 0.25 to 0.5. When the contact area between the upper portion 31 of the supporting layer 30 and the micro semiconductor device 20 is too large, the difficulty of subsequent transferring process would be increased. Furthermore, when the contact area between the upper portion 31 of the supporting layer 30 and the micro semiconductor device 20 is too small, the supporting layer 30 would provide a poor fixing and supporting effect.

As shown in FIG. 4, the bottom surface 21 of the micro semiconductor device 20 has four edges E1, E2, E3 and E4 and four vertices C1, C2, C3 and C4. The edge E1 of the bottom surface 21 is positioned opposite the edge E3 of the bottom surface 21, and the edge E2 of the bottom surface 21 is positioned opposite the edge E4 of the bottom surface 21. The vertex C1 of the micro semiconductor device 20 is defined by the intersection of the edge E1 and the edge E2, the vertex C2 of the micro semiconductor device 20 is defined by the intersection of the edge E2 and the edge E3, the vertex C3 of the micro semiconductor device 20 is defined by the intersection of the edge E3 and the edge E4, and the vertex C4 of the micro semiconductor device 20 is defined by the intersection of the edge E4 and the edge E1. Namely, a straight line connecting the vertices C1 and C3 overlaps one diagonal of the bottom surface 21 of the micro semiconductor device 20, and a straight line connecting the vertices C2 and C4 overlaps another diagonal of the bottom surface 21 of the micro semiconductor device 20. According to embodiments of the disclosure, the bottom surface 21 of the micro semiconductor device 20 can have two first regions 1, and the two first regions 1 directly contact the edges E2 and E4 of the bottom surface 21 respectively, as shown in FIG. 4.

As shown in FIGS. 2 and 4, the area of the bottom surface 21 between the first electrode 40a and the second electrode 40b is defined as a second region 2. Herein, a projection of the second region 2 in the first direction X completely overlaps a projection of the bottom surface 21 occupied by the first electrode 40a (or the second electrode 40b) in the first direction X. According to embodiments of the disclosure, the supporting layer 30 does not is in direct contact with the second region 2. Namely, the first region 1 does not overlap the second region 2.

Figure 5:
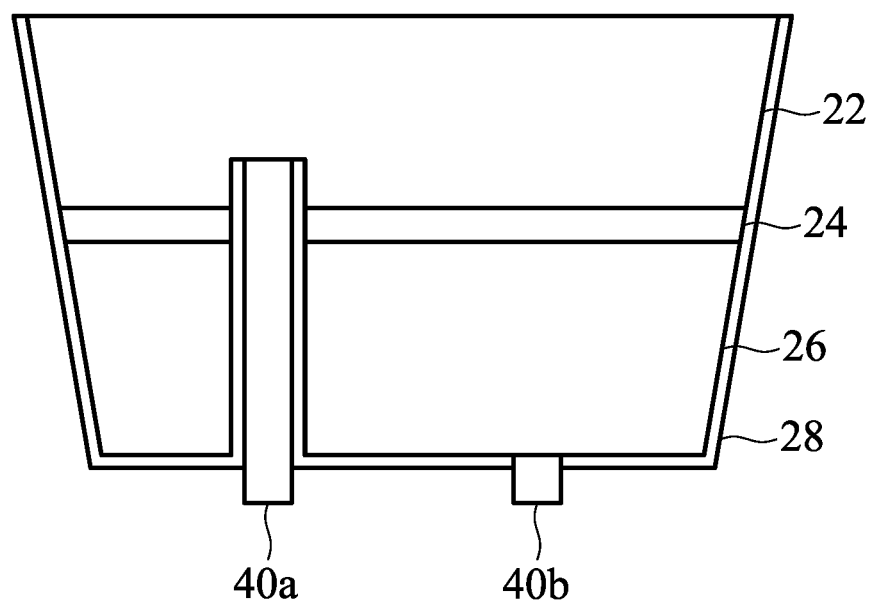
FIG. 5 is a cross-sectional view of the micro semiconductor device in accordance with embodiments of the disclosure.

FIG. 5 is a cross-sectional view of the micro semiconductor device in accordance with embodiments of the disclosure. Herein, the micro semiconductor device 20 includes a first semiconductor layer 22, a light-emitting layer 24, a second semiconductor layer 26, an insulating layer 28, a first electrode 40a, and a second electrode 40b. The first electrode 40a and the second electrode 40b have opposite electrical charges. According to embodiments of the disclosure, the first semiconductor layer 22 can be n-type semiconductor layer and the second semiconductor layer 26 can be p-type semiconductor layer. According to embodiments of the disclosure, the first semiconductor layer 22 can be p-type semiconductor layer and the second semiconductor layer 26 can be n-type semiconductor layer. The light emitting layer 24 and the second semiconductor layer 26 are disposed on the first semiconductor layer 22 sequentially. Namely, the light emitting layer 24 is disposed between the first semiconductor layer 22 and the second semiconductor layer 26. According to embodiments of the disclosure, the first electrode 40a and the second electrode 40b is disposed on the second semiconductor layer 26, and the first electrode 40a can pass through the second semiconductor layer 26 and the light emitting layer 24 and insert into the first semiconductor layer 22. The first electrode 40a electrically connects the first semiconductor layer 22. The insulating layer 28 is disposed between the first electrode 40a and the light emitting layer 24 and disposed between the first electrode 40a and the second semiconductor layer 26, in order to prevent the first electrode 40a from electrically connecting the light emitting layer 24 and the second semiconductor layer 26. In addition, the insulating layer 28 can further extend to the bottom surface of the second semiconductor layer 26 and the surrounding surface of the first semiconductor layer 22, the light emitting layer 24 and the second semiconductor layer 26. According to other embodiments of the disclosure, the micro semiconductor device 20 of the disclosure has tapered sidewalls (i.e. the profile of the micro semiconductor device 20 is an inverted trapezoid which has a greater upper width and a smaller bottom width). FIG. 5 is merely an example of the micro semiconductor device 20 of the disclosure, and is not intended to limit the type of the micro semiconductor device 20. The micro semiconductor device 20 of the disclosure can be any suitable micro semiconductor device. The profile of the micro semiconductor device 20 of the disclosure can also be a positive trapezoid which has a smaller upper width and a greater bottom width, a rectangle, or another suitable shape. The number of the first electrode 40a and the second electrode 40b shown in this embodiment is respectively only one, but the invention is not limited to these embodiments, and there may be a plurality of first electrodes and second electrodes. The accompanying drawings show the micro semiconductor device 20 of the micro semiconductor structure 100 in an inverted trapezoid in order to simplify the illustration.

Figure 6A:
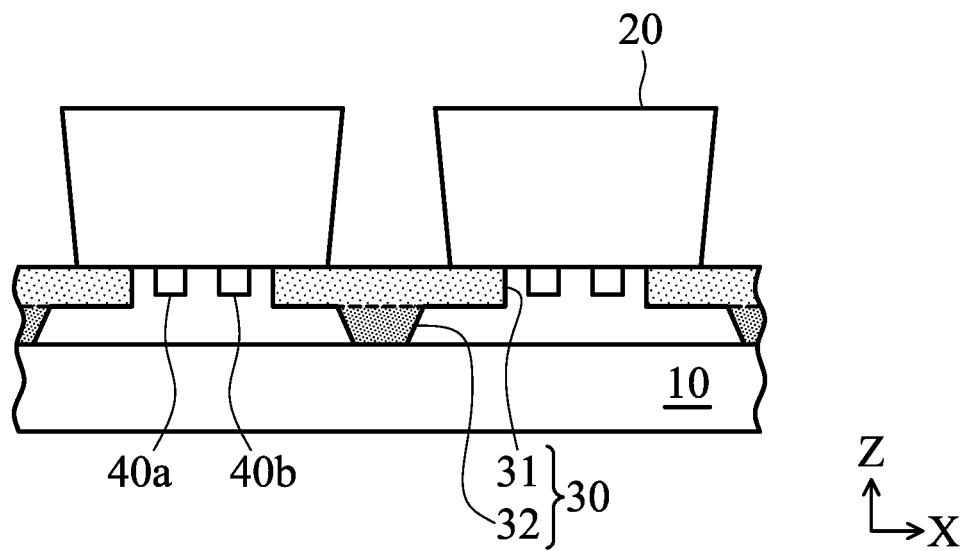
FIGS. 6A-6C are cross-sectional views of the micro semiconductor structures in accordance with embodiments of the disclosure.
Figure 6B:
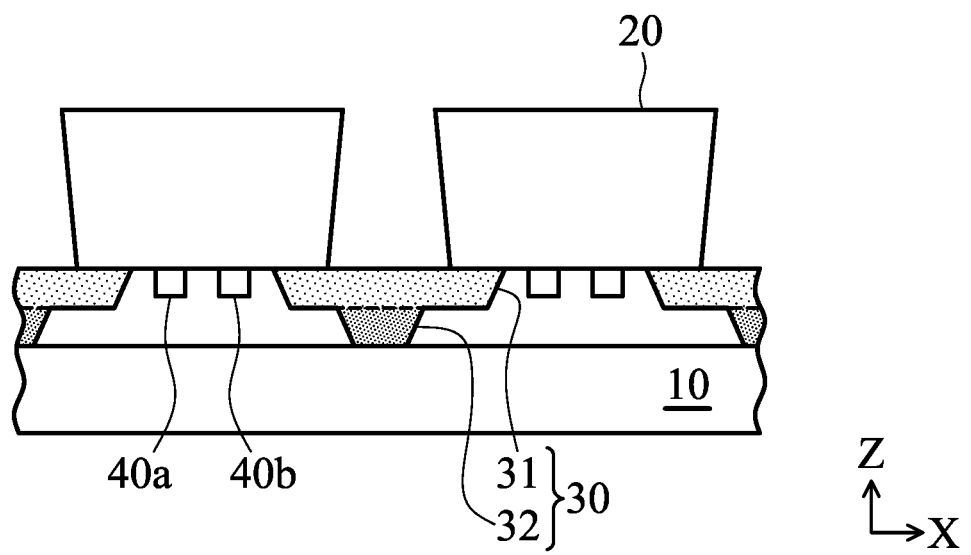
Figure 6C:
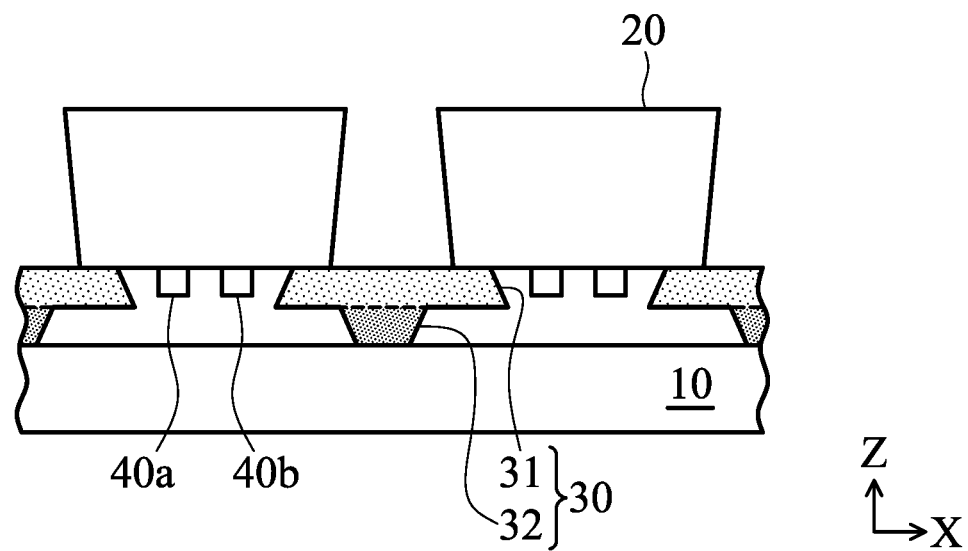

FIG. 6A is a cross-sectional view (in the first direction X) of the micro semiconductor structure in accordance with embodiments of the disclosure. As shown in FIG. 6A, the profile of the bottom portion 32 of the supporting layer 30 can be an inverted trapezoid which has a greater upper width and a smaller bottom width (i.e. the profile of the bottom portion 32 of the supporting layer 30 in the first direction X has tapered sidewalls). As a result, the bottom portion 32, which has a greater upper width and a smaller bottom width, can easily keep the balance of the upper portion 31 of the supporting layer 30, thereby firmly fixing the upper portion 31 of the supporting layer 30 on the bottom portion 32 of the supporting layer 30. In addition, in the subsequent transferring process, the bottom portion 32 of the supporting layer 30, which has a greater upper width and a smaller bottom width, can ensure that the upper portion 31 can be broken, thereby increasing the success rate of the process for picking up and transferring the micro semiconductor device 20. According to some embodiments of the disclosure, the upper portion 31 of the supporting layer 30 can have an inverted trapezoid which has a greater upper width and a smaller bottom width (i.e. the profile of the upper portion 31 of the supporting layer 30 in the first direction X has tapered sidewalls), as shown in FIG. 6B. In addition, according to other embodiments of the disclosure, the upper portion 31 of the supporting layer 30 can have a trapezoidal profile which has a smaller upper width and a greater bottom width, as shown in FIG. 6C.

Figure 7:
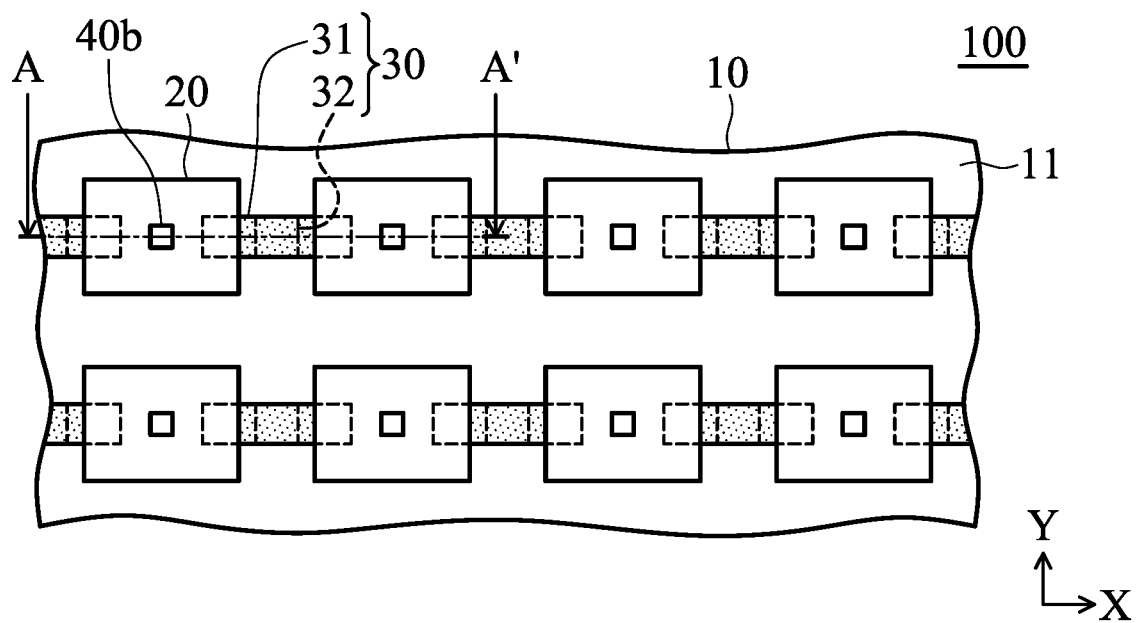
FIG. 7 is a top view of a micro semiconductor structure in accordance with one embodiment of the disclosure.
Figure 8:
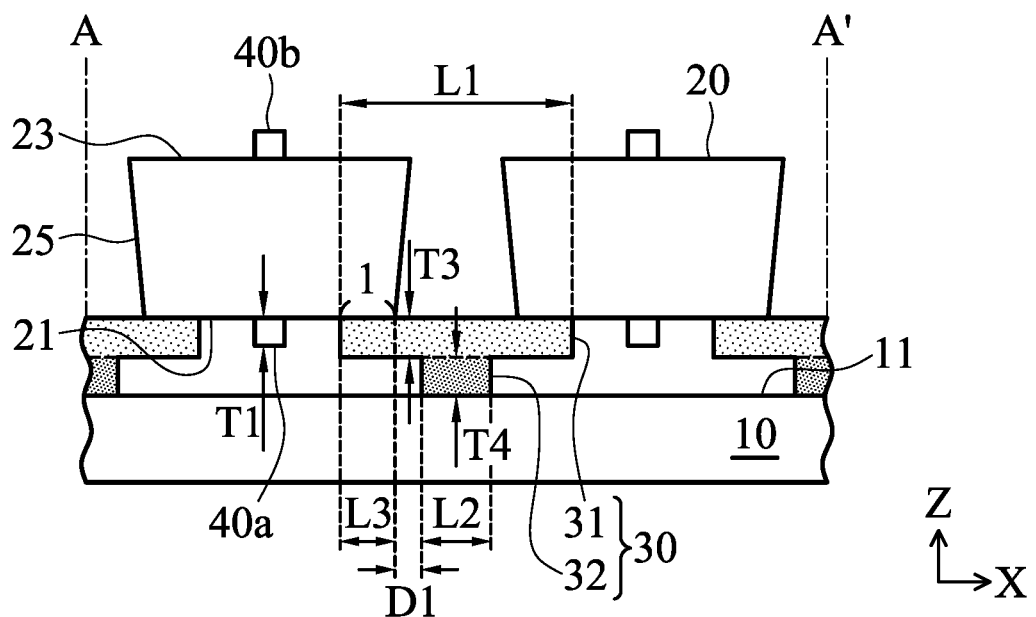
FIG. 8 is a cross-sectional view of the micro semiconductor structure taken along line A-A' of FIG. 7.
Figure 9:
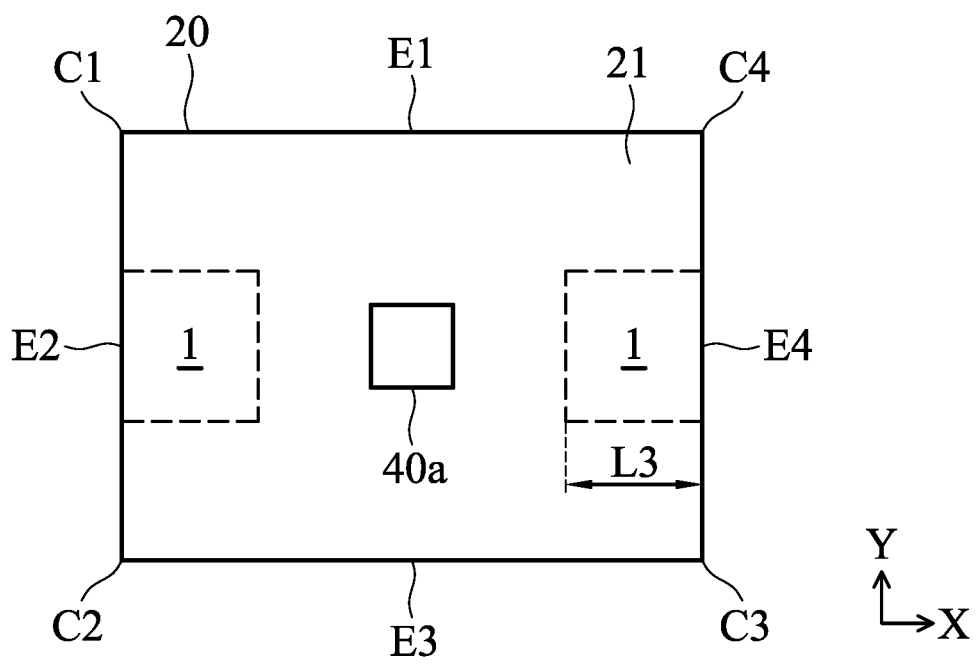
FIG. 9 is a bottom view of any one of the micro semiconductor devices of the micro semiconductor structure of FIG. 7.

FIG. 7 is a top view of a micro semiconductor structure 100 in accordance with another embodiment of the disclosure, FIG. 8 is a cross-sectional view of the micro semiconductor structure 100 taken along line A-A' of FIG. 7, and FIG. 9 is a bottom view of any one of the micro semiconductor devices 20 of the micro semiconductor structure 100 of FIG. 7. The supporting layer 30 and the substrate 10 are not shown in FIG. 9 for convenience of illustration. As shown in FIGS. 8 and 9, the micro semiconductor device 20 can be a perpendicular type micro semiconductor device. Namely, the first electrode 40a of the micro semiconductor device 20 is disposed on the bottom surface 21 of the micro semiconductor device 20, and the second electrode 40b is disposed on the top surface 23 of the micro semiconductor device 20. The first electrode 40a and the second electrode 40b are opposite to each other.

As shown in FIG. 8, the thickness T3 of the upper portion 31 of the supporting layer 30 is less than the thickness T1 of the first electrode 40a. According to embodiments of the disclosure, the sum (i.e. the thickness of the supporting layer 30, T3+T4) of the thickness T3 of the upper portion 31 and the thickness T4 of the bottom portion 32 is greater than the thickness T1 of the first electrode 40a.

As shown in FIG. 9, when only one electrode disposed on the bottom surface 21 of the micro semiconductor device 20, the first region 1 (the area of the bottom surface 21 which is in direct contact with to the upper portion 31) does not contact the first electrode 40a. The ratio (A1/A2) of the surface area A1 of the first region 1 to the surface area A2 of the bottom surface 21 of the micro semiconductor device 20 is greater than or equal to about 0.05 and less than or equal to about 0.5, such as from about 0.05 to 0.5, from about 0.1 to 0.5, from about 0.2 to 0.5, or from about 0.25 to 0.5. When the contact area (i.e. first region) between the upper portion 31 of the supporting layer 30 and the micro semiconductor device 20 is too large, the difficulty of subsequent transferring process would be increased. Furthermore, when the contact area between the upper portion 31 of the supporting layer 30 and the micro semiconductor device 20 is too small, the supporting layer 30 would provide a poor fixing and supporting effect. According to some embodiments of the disclosure, the upper portion 31 of the supporting layer 30 can contact to the first electrode 40a of the perpendicular type micro semiconductor device 20.

Figure 10A:
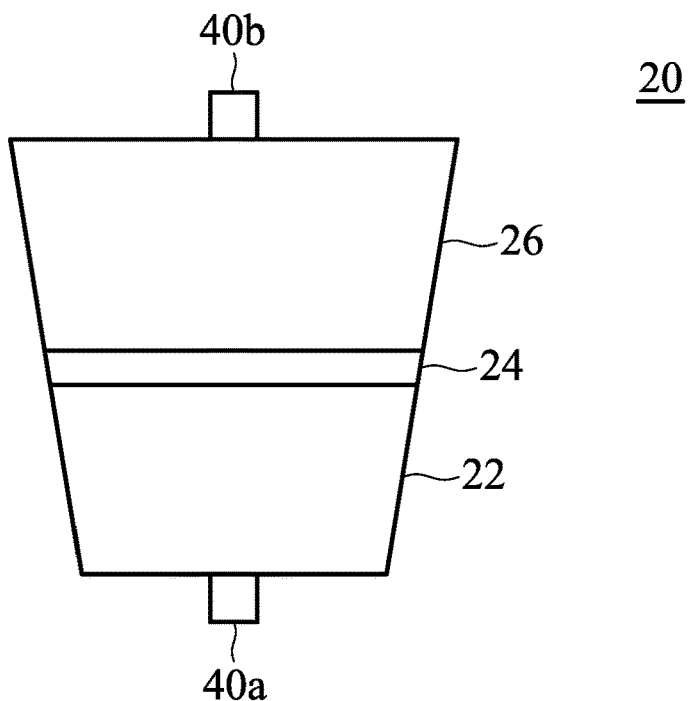
FIGS. 10A and 10B are cross-sectional views of the micro semiconductor device in accordance with embodiments of the disclosure.
Figure 10B:
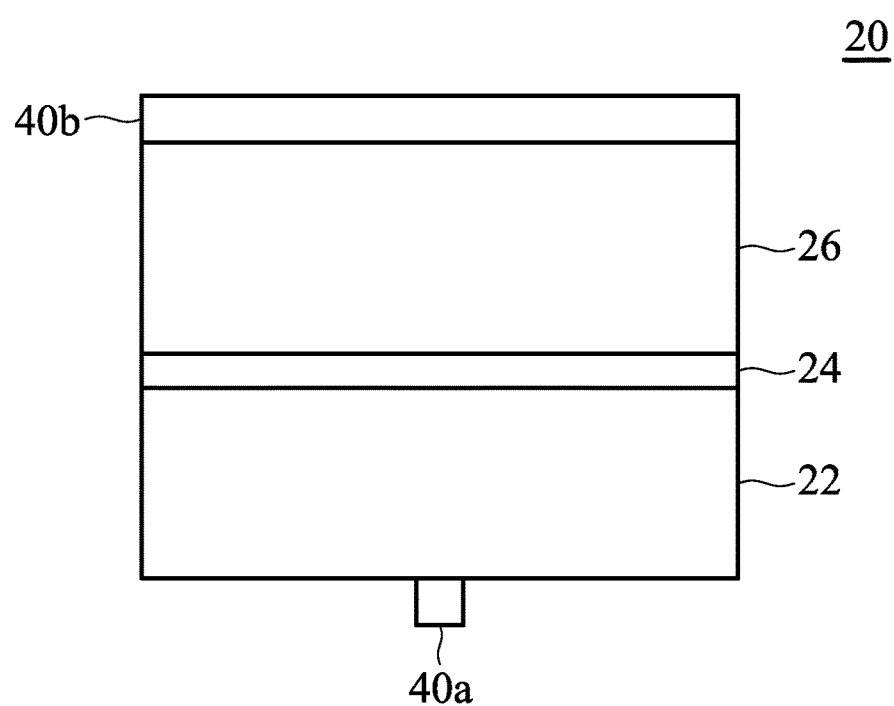

FIG. 10A is a cross-sectional view of the micro semiconductor device 20 of FIG. 8. The micro semiconductor device 20 includes a first semiconductor layer 22, a light emitting layer 24, a second semiconductor layer 26, a first electrode 40a, and a second electrode 40b. The light emitting layer 24 and the second semiconductor layer 26 are disposed on the first semiconductor layer 22 sequentially. Namely, the light emitting layer 24 is disposed between the first semiconductor layer 22 and the second semiconductor layer 26. The first electrode 40a is disposed on the first semiconductor layer 22, and the second electrode 40b is disposed on the second semiconductor layer 26. In addition, the micro semiconductor device 20 can further include an insulating layer (not shown) on the surrounding surface of the first semiconductor layer 22, the second semiconductor layer 26, and/or the light emitting layer 24. According to embodiments of the disclosure, the orthogonal projection of the first electrode 40a onto the substrate 10 can overlap the orthogonal projection of the second electrode 40b onto the substrate 10. According to other embodiments of the disclosure, the surface area of orthogonal projection of the first electrode 40a onto the substrate 10 is greater than or less than the surface area of the orthogonal projection of the second electrode 40b onto the substrate 10. In addition, the second electrode 40b can completely cover the surface of the second semiconductor layer 26, as shown in FIG. 10B. Therefore, the orthogonal projection of the second electrode 40b onto the substrate 10 can overlap the orthogonal projection of the upper portion 31 of the supporting layer 30 onto the substrate 10. When the second electrode 40b keeps away from the upper portion 31 of the supporting layer 30, the electrical connection between the second electrode 40b and the second semiconductor layer 26 can be improved, and the yield of transferring process would not be affected by the second electrode 40b.

Figure 11:
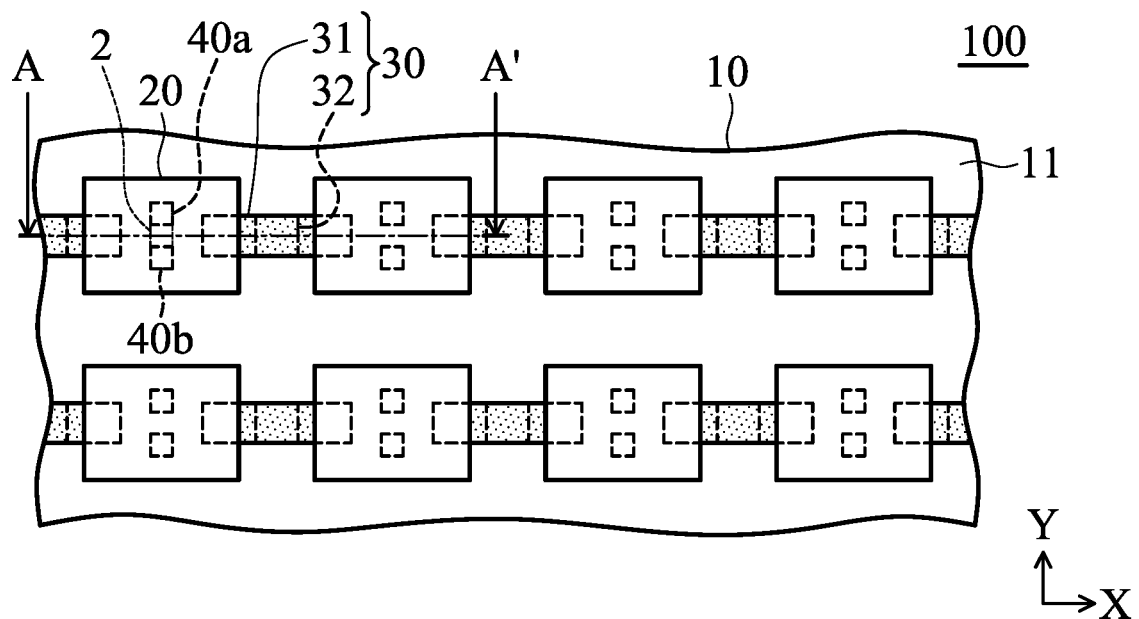
FIG. 11 is a top view of a micro semiconductor structure in accordance with one embodiment of the disclosure.
Figure 12:
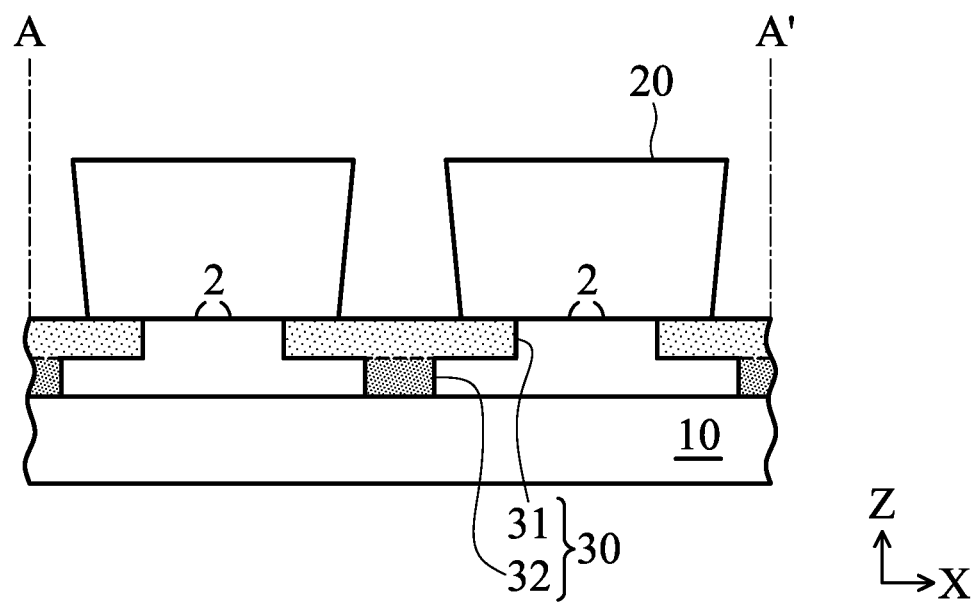
FIG. 12 is a cross-sectional view of the micro semiconductor structure taken along line A-A' of FIG. 11.
Figure 13:
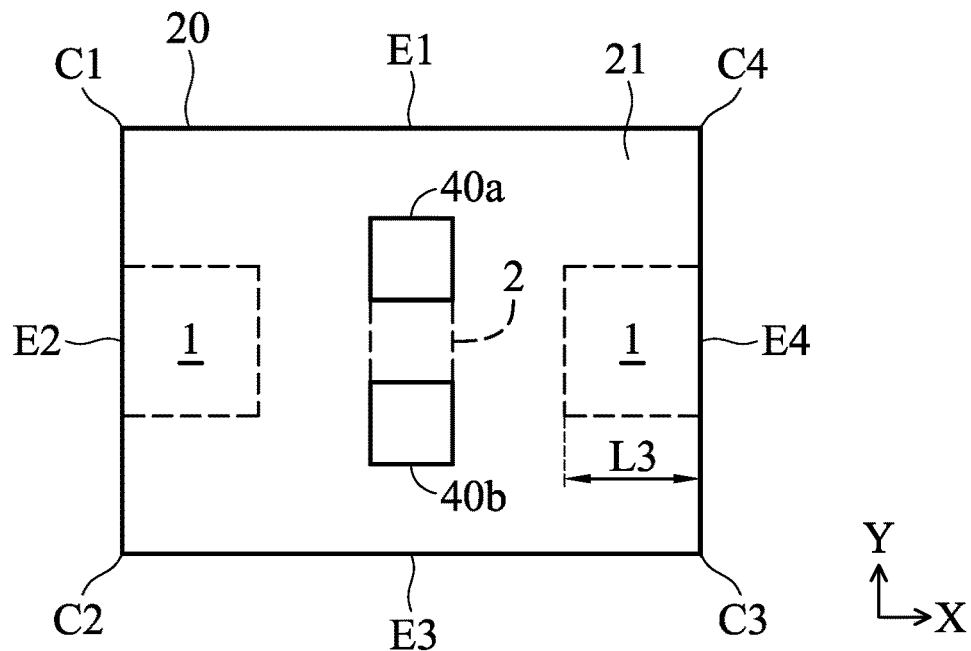
FIG. 13 is a bottom view of any one of the micro semiconductor devices of the micro semiconductor structure of FIG. 11.
Figure 14A:
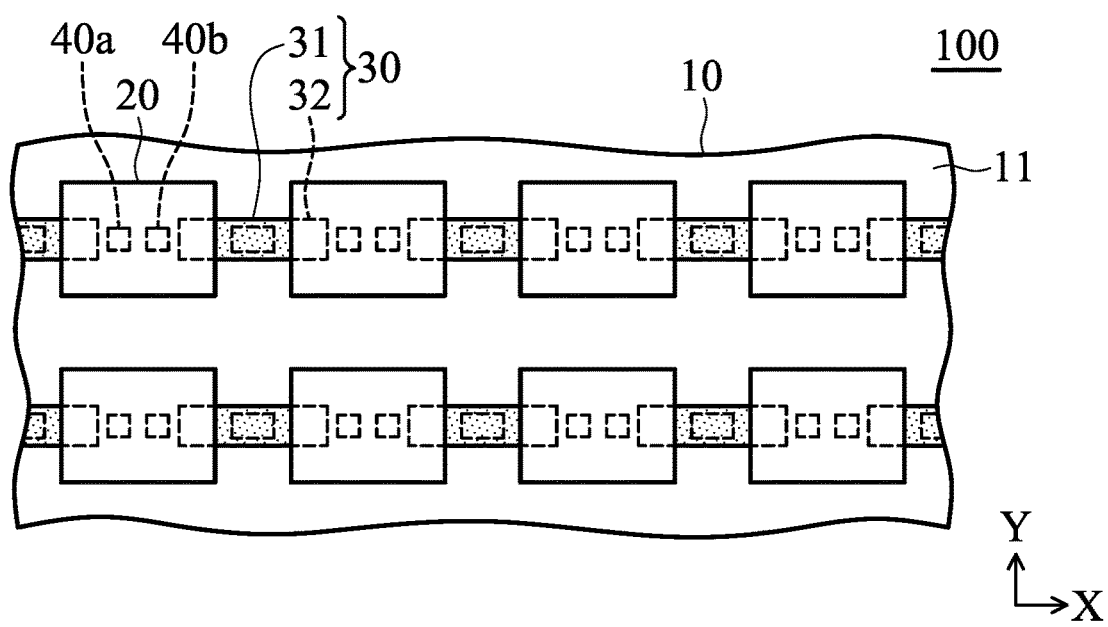
FIGS. 14A-14C are top views of the micro semiconductor structures in accordance with embodiments of the disclosure.
Figure 14B:
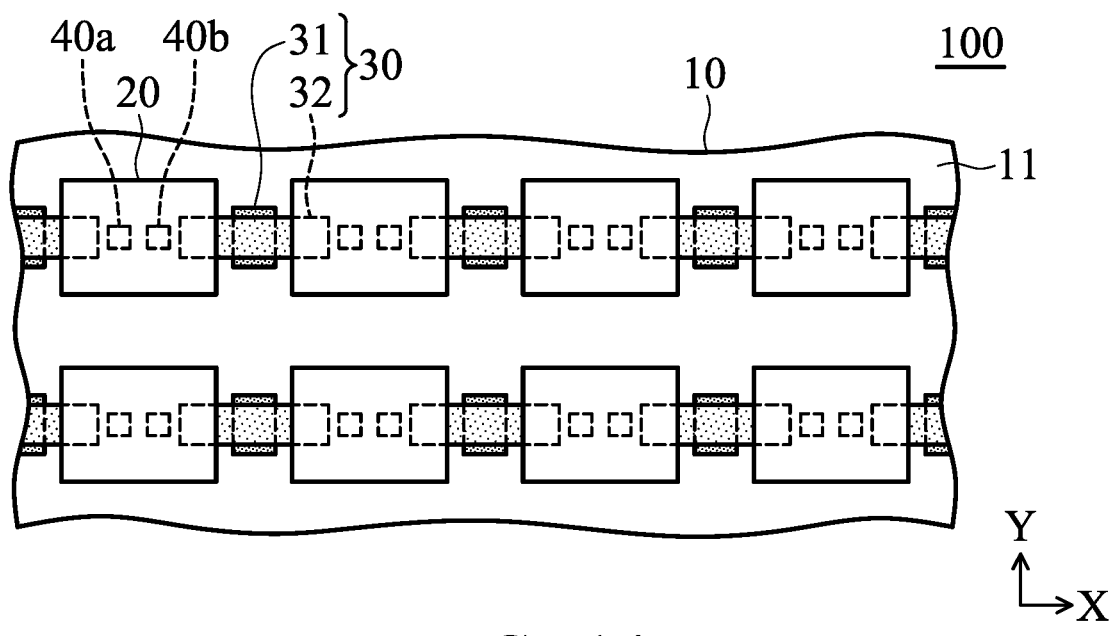
Figure 14C:
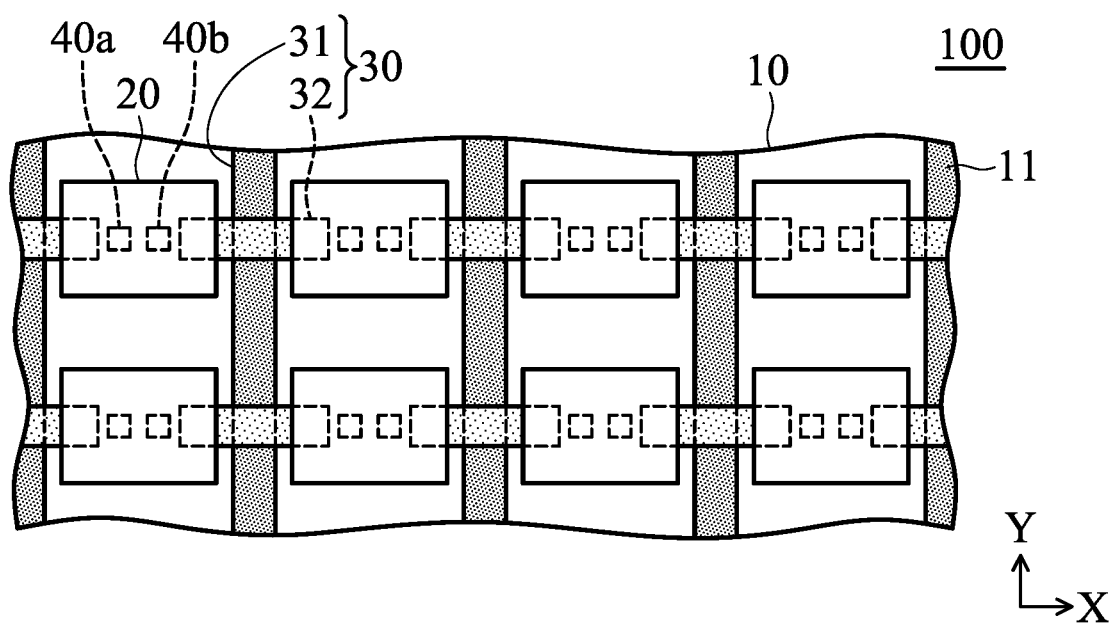

FIG. 11 is a top view of a micro semiconductor structure 100 in accordance with another embodiment of the disclosure, FIG. 12 is a cross-sectional view of the micro semiconductor structure 100 taken along line A-A' of FIG. 11, and FIG. 13 is a bottom view of any one of the micro semiconductor devices 20 of the micro semiconductor structure 100 of FIG. 11. The supporting layer 30 and the substrate 10 are not shown in FIG. 13 for convenience of illustration. As shown in FIG. 11, the first electrode 40a and the second electrode 40b of the micro semiconductor device 20 are disposed on the bottom surface 21 of the micro semiconductor device 20. The upper portion 31 of the supporting layer 30 extends in the first direction X, and the arranging direction of the first electrode 40a and the second electrode 40b of the micro semiconductor device 20 are disposed in a second direction Y, wherein the first direction X is orthogonal to the second direction Y. Since the arranging direction of the first electrode 40a and the second electrode 40b of the micro semiconductor device 20 and the arranging direction of the supporting layer 30 are in an interlaced configuration, there is a relatively large space between the first electrode 40a (or the second electrode 40b) and the supporting layer 30 to avoid contacting each other, thereby increasing the process tolerance. The area of the bottom surface 21 between the first electrode 40a and the second electrode 40b is defined as a second region 2. As shown in FIG. 13, the projection of the second region 2 in the second direction Y completely overlaps a projection of the bottom surface 21 occupied by the first electrode 40a (or the second electrode 40b) in the second direction Y. According to embodiments of the disclosure, the supporting layer 30 does not directly contact with the second region 2. Namely, the first region 1 does not overlap the second region 2. According to embodiments of the disclosure, an orthogonal projection of the bottom portion 32 of the supporting layer 30 onto the substrate 10 overlaps an orthogonal projection of the upper portion 31 of the supporting layer 30 onto the substrate 10, and the width of the bottom portion 32 of the supporting layer 30 in the second direction Y can be equal to the width of the upper portion 31 of the supporting layer 30 in the second direction Y, as shown in FIG. 11. According to some embodiments of the disclosure, the orthogonal projection of the bottom portion 32 of the supporting layer 30 onto the substrate 10 is completely covered by the orthogonal projection of the upper portion 31 of the supporting layer 30 onto the substrate 10, and the width of the bottom portion 32 of the supporting layer 30 in the second direction Y can be less than the width of the upper portion 31 of the supporting layer 30 in the second direction Y, as shown in FIG. 14A. In addition, according to some embodiments of the disclosure, an orthogonal projection of the bottom portion 32 of the supporting layer 30 onto the substrate 10 can partial overlaps an orthogonal projection of the upper portion 31 of the supporting layer 30 onto the substrate 10, and the width of the bottom portion 32 of the supporting layer 30 in the second direction Y is greater than the width of the upper portion 31 of the supporting layer 30 in the second direction Y, as shown in FIG. 14B. FIG. 14C is top view of the micro semiconductor structure 100 in accordance with one embodiment of the disclosure. As shown in FIG. 14C, the bottom portion 32 of the supporting layer 30 can extend in a second direction Y, resulting in there being a plurality of upper portions 31 of the supporting layer 30 disposed on the bottom portion 32 of the supporting layer 30. Namely, the bottom portion 32 of the supporting layer 30 is continuous, and a plurality of discontinuous upper portions 31 of the supporting layer 30 is disposed on the bottom portion 32 of the supporting layer 30. In the embodiment of FIG. 14C, since the arranging direction of the first electrode 40a and the second electrode 40b of the micro semiconductor device 20 and the arranging direction of the supporting layer 30 are in an interlaced configuration and the bottom portion 32 of the supporting layer 30 is continuous, the micro semiconductor device 20 is firmly fixed on the substrate 10 by the supporting layer 30, thereby enhancing the process efficiency and yield.

Figure 15:
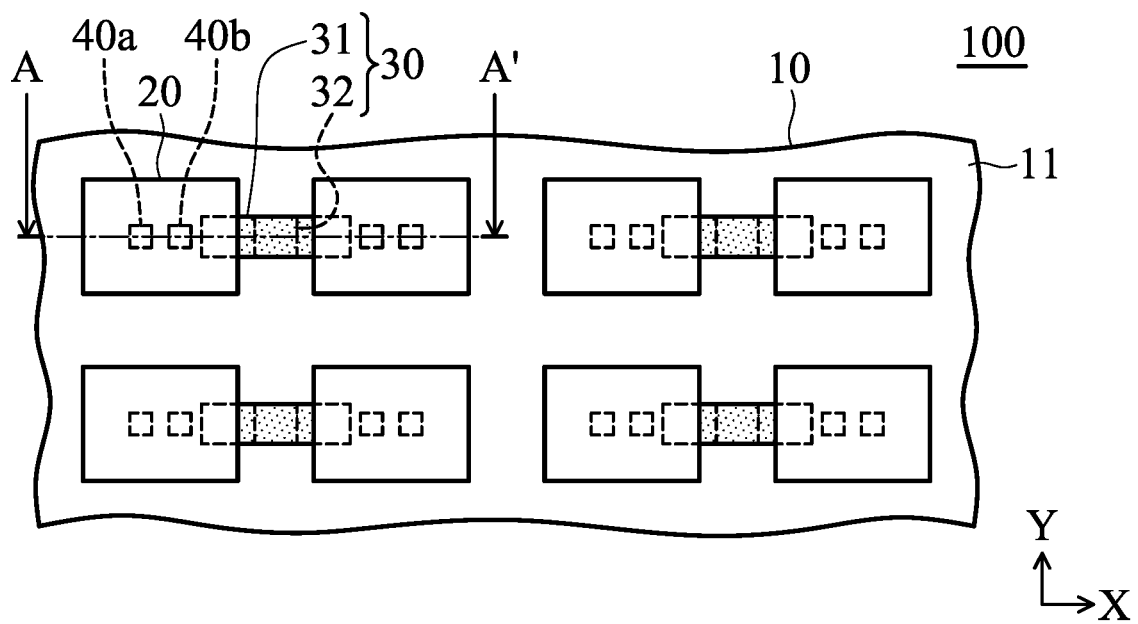
FIG. 15 is a top view of a micro semiconductor structure in accordance with one embodiment of the disclosure.
Figure 16:
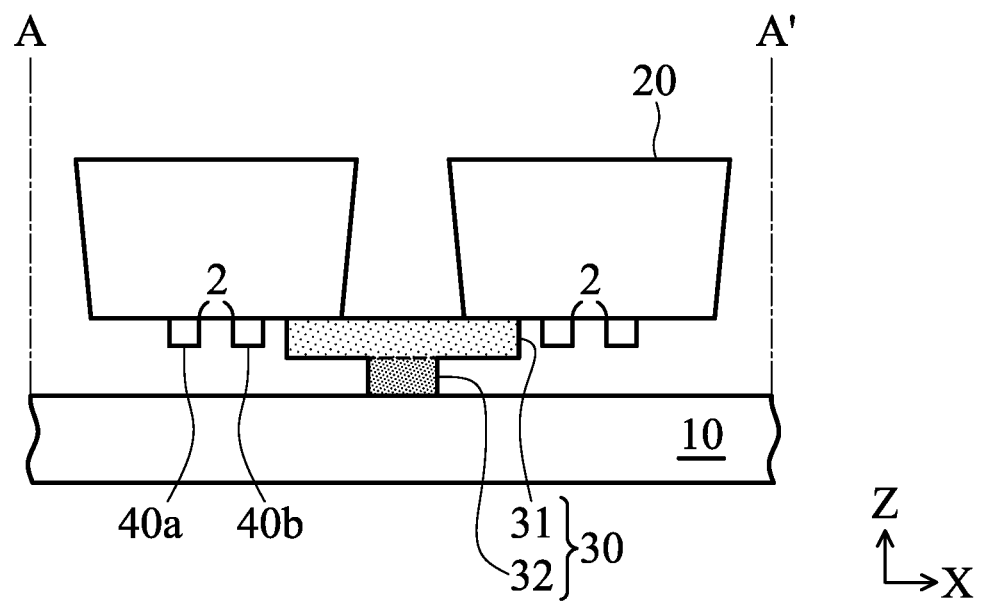
FIG. 16 is a cross-sectional view of the micro semiconductor structure taken along line A-A' of FIG. 15.
Figure 17:
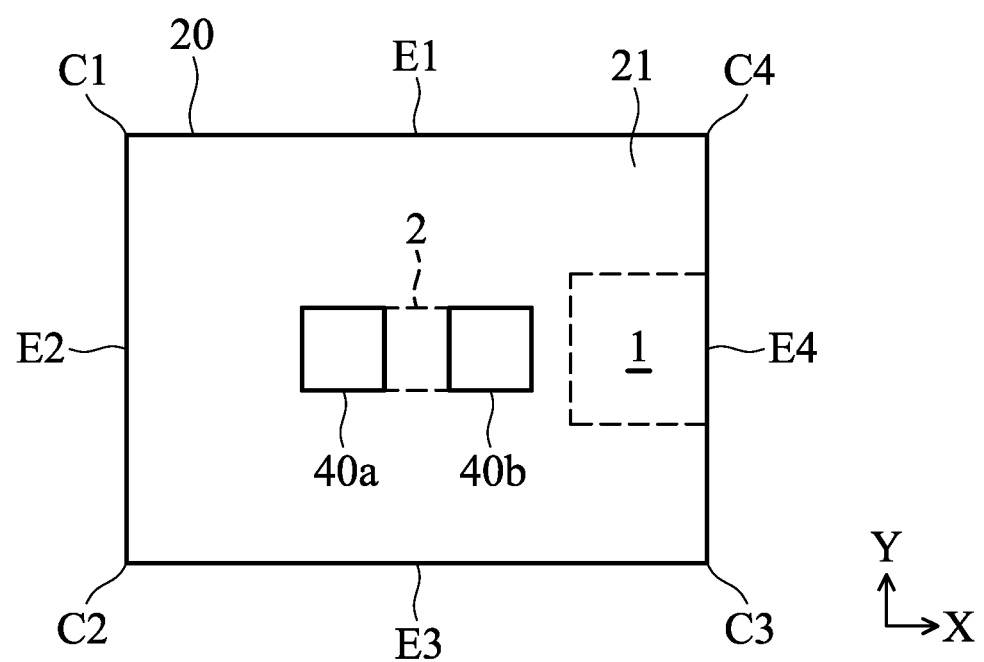
FIG. 17 is a bottom view of any one of the micro semiconductor devices of the micro semiconductor structure of FIG. 15.

FIG. 15 is a top view of a micro semiconductor structure 100 in accordance with another embodiment of the disclosure, FIG. 16 is a cross-sectional view of the micro semiconductor structure 100 taken along line A-A' of FIG. 15, and FIG. 17 is a bottom view of any one of the micro semiconductor devices 20 of the micro semiconductor structure 100 of FIG. 15. The supporting layer 30 and the substrate 10 are not shown in FIG. 17 for convenience of illustration. As shown in FIGS. 15 and 16, the micro semiconductor device 20 merely contacts one upper portion 31 of the supporting layer 30, and the upper portion 31 of the supporting layer 30 is in direct contact with an edge of the bottom surface 21 of the micro semiconductor device 20. There are two adjacent micro semiconductor devices 20 simultaneously disposed on the upper portion 31 of the supporting layer 30, as shown in FIG. 15. The area of the bottom surface 21, which is in direct contact with to the upper portion 31, is defined as the first region 1. As shown in FIG. 17, the bottom surface 21 of the micro semiconductor device 20 has only one first region 1, and the first region is in direct contact with the edge E4 of the bottom surface 21. Since the micro semiconductor device 20 merely contacts one upper portion 31 of the supporting layer 30, the micro semiconductor device 20 can be densely arranged on the substrate, and the supporting layer 30 provides a great fixing and supporting effect. According to some embodiments of the disclosure, the bottom surface 21 of the micro semiconductor device 20 has only one first region 1, and the first region 1 is in direct contact with at least one edge E1, E2 or E3 or at least one of vertex C1, C2, C3 or C4.

Figure 18:
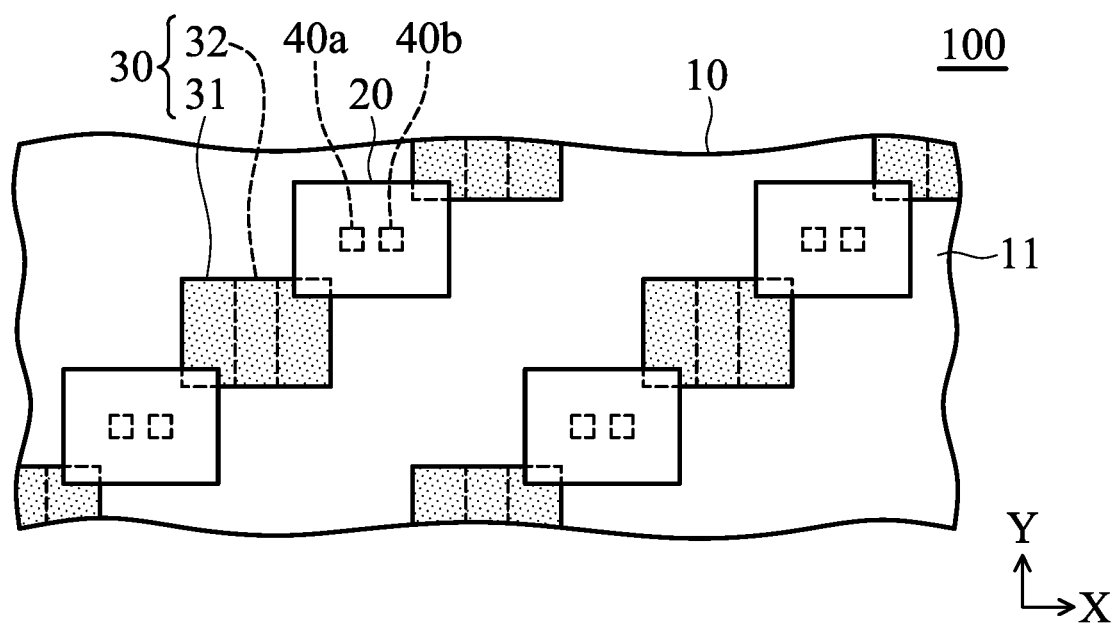
FIG. 18 is a top view of a micro semiconductor structure in accordance with one embodiment of the disclosure.
Figure 19:
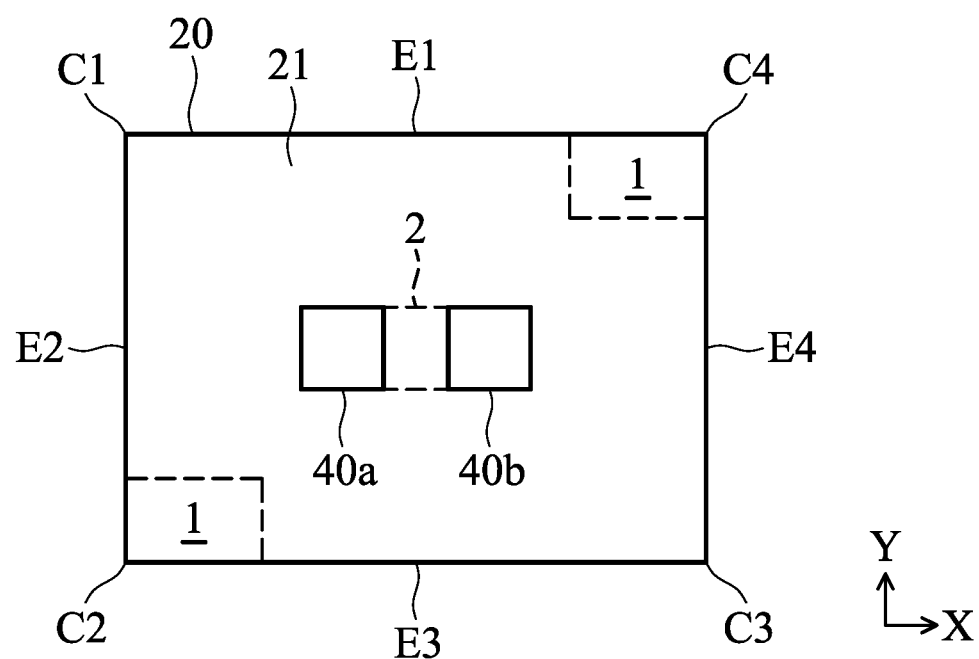
FIG. 19 is a bottom view of any one of the micro semiconductor devices of the micro semiconductor structure of FIG. 18.

FIG. 18 is a top view of a micro semiconductor structure 100 in accordance with another embodiment of the disclosure, and FIG. 19 is a bottom view of any one of the micro semiconductor devices 20 of the micro semiconductor structure 100 of FIG. 18. The supporting layer 30 and the substrate 10 are not shown in FIG. 19 for convenience of illustration. As shown in FIGS. 18 and 19, the micro semiconductor device 20 simultaneously contacts two upper portions 31 of the supporting layer 30, and the two upper portions 31 of the supporting layer 30 cover and directly contact the vertices C2 and C4 of the bottom surface 21 of the micro semiconductor device 20 respectively. Namely, in the top view of the micro semiconductor structure, the two upper portions 31 of the supporting layer 30 locate on a diagonal of the bottom surface 21 of the micro semiconductor device 20. As shown in FIG. 19, the bottom surface 21 of the micro semiconductor device 20 simultaneously has two first regions 1. The two first regions 1 directly contact the vertices C2 and C4 of the bottom surface 21 respectively. According to some embodiments of the disclosure, the micro semiconductor device 20 contacts two upper portions 31 of the supporting layer 30, and the two upper portions 31 of the supporting layer 30 directly contact the vertices C2 and C4 of the bottom surface 21 of the micro semiconductor device 20 respectively. According to other embodiments of the disclosure, the micro semiconductor device 20 simultaneously contacts two upper portion 31 of the supporting layer 30, and the two upper portions 31 of the supporting layer 30 is in direct contact with any two adjacent vertices (such as the vertices C1 and C2, the vertices C2 and C3, the vertices C3 and C4, or the vertices C4 and C1) of the bottom surface 21 of the micro semiconductor device 20.

Figure 20:
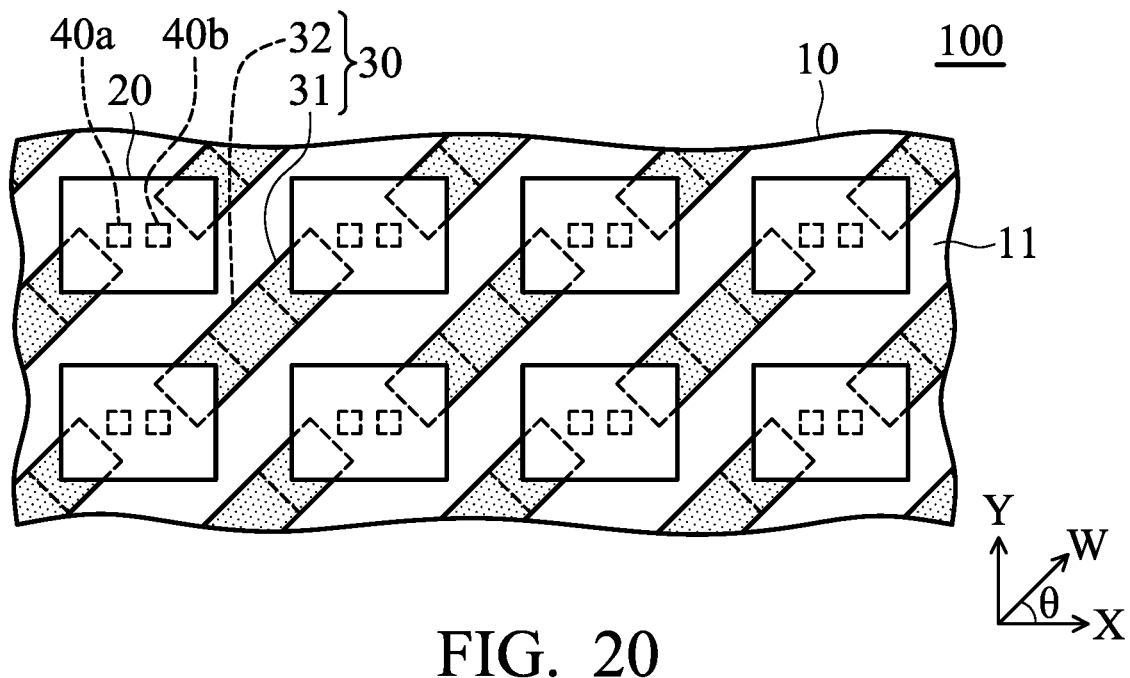
FIG. 20 is a top view of a micro semiconductor structure in accordance with one embodiment of the disclosure.
Figure 21:
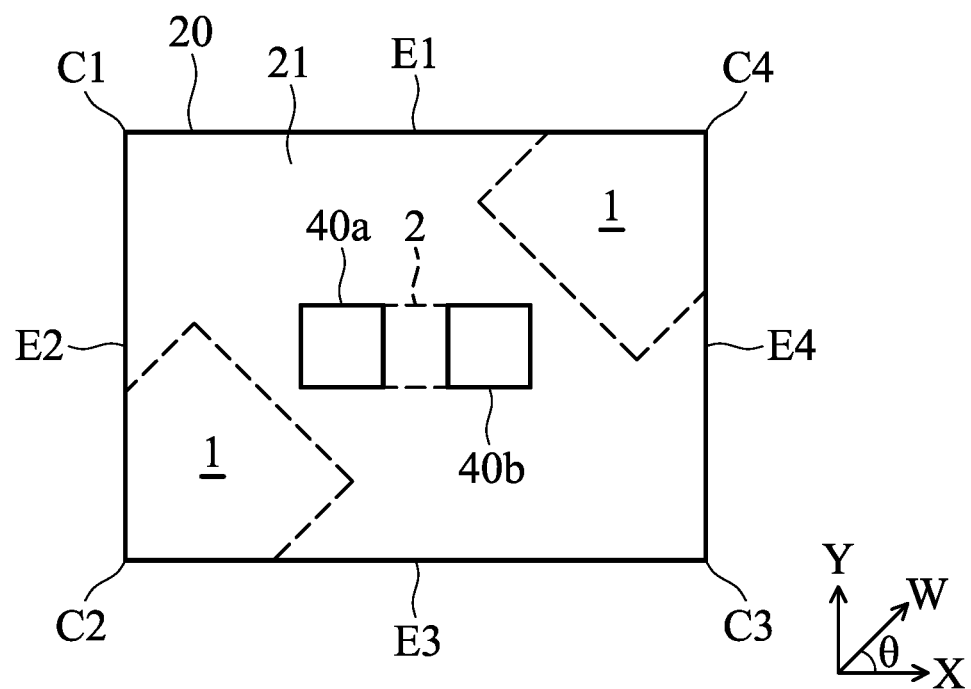
FIG. 21 is a bottom view of any one of the micro semiconductor devices of the micro semiconductor structure of FIG. 20.

FIG. 20 is a top view of a micro semiconductor structure 100 in accordance with another embodiment of the disclosure, and FIG. 21 is a bottom view of any one of the micro semiconductor devices 20 of the micro semiconductor structure 100 of FIG. 20. The supporting layer 30 and the substrate 10 are not shown in FIG. 21 for convenience of illustration. As shown in FIG. 20, the first electrode 40a and the second electrode 40b are disposed on the bottom surface 21 of the micro semiconductor device 20 in the first direction X, and the upper portion 31 of the supporting layer 30 extends in a fourth direction W, wherein the fourth direction W is parallel to the substrate 10. The angle θ defined by the first direction X and the fourth direction W is from about 5 degrees to 85 degrees, such as 30 degrees, 45 degrees, or 60 degrees. As shown in FIGS. 20 and 21, the micro semiconductor device 20 simultaneously contact two upper portions 31 of the supporting layer 30, and the two upper portions 31 of the supporting layer 30 cover and is in direct contact with the vertices C2 and C4 of the bottom surface 21 of the micro semiconductor device 20. Namely, in the top view of the micro semiconductor structure, the two upper portions 31 of the supporting layer 30 locate on a diagonal of the bottom surface 21 of the micro semiconductor device 20. As shown in FIG. 21, the bottom surface 21 of the micro semiconductor device 20 simultaneously has two first regions 1. The two first regions 1 directly contact the vertices C2 and C4 of the bottom surface 21 respectively.

Figure 22:
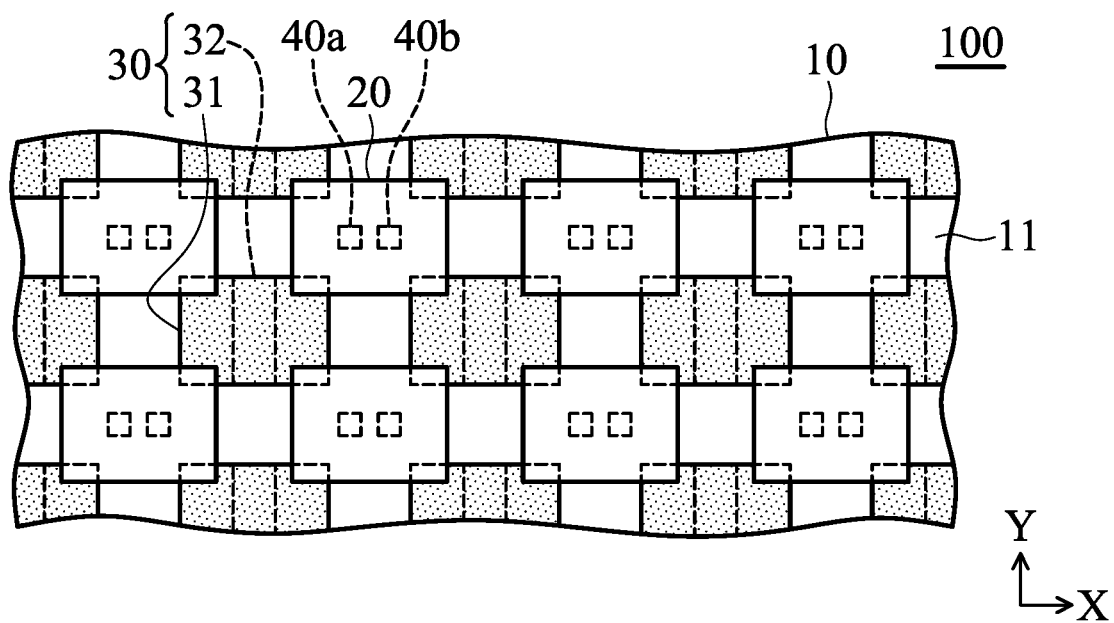
FIG. 22 is a top view of a micro semiconductor structure in accordance with one embodiment of the disclosure.
Figure 23:
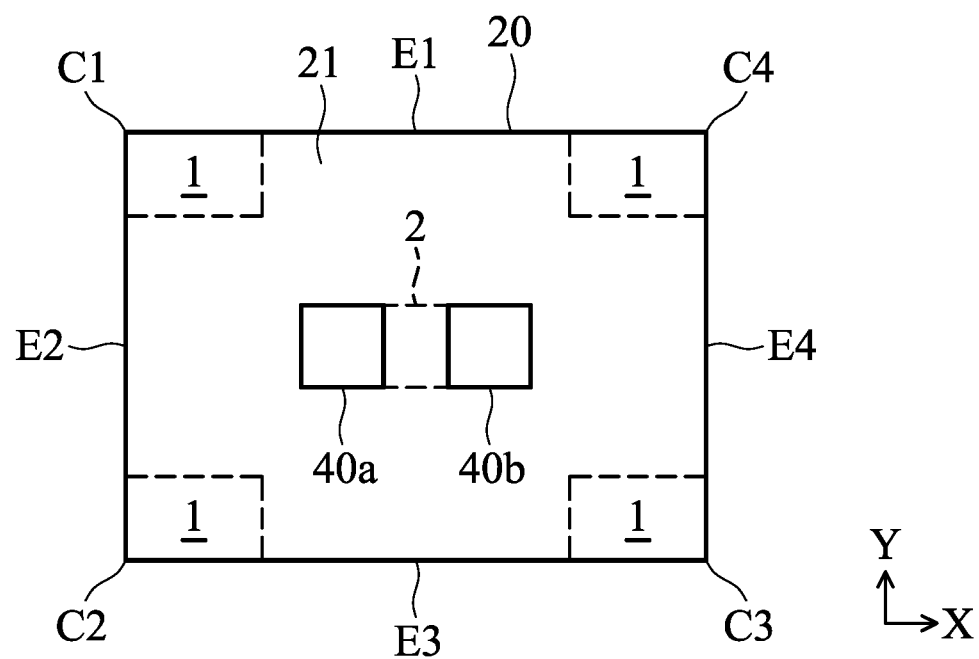
FIG. 23 is a bottom view of any one of the micro semiconductor devices of the micro semiconductor structure of FIG. 22.

FIG. 22 is a top view of a micro semiconductor structure 100 in accordance with another embodiment of the disclosure, and FIG. 23 is a bottom view of any one of the micro semiconductor devices 20 of the micro semiconductor structure 100 of FIG. 22. The supporting layer 30 and the substrate 10 are not shown in FIG. 23 for convenience of illustration. As shown in FIGS. 22 and 23, the micro semiconductor device 20 simultaneously contacts four upper portions 31 of the supporting layer 30, and the four upper portions 31 of the supporting layer 30 cover and directly contact the vertices C1, C2, C3 and C4 of the bottom surface 21 of the micro semiconductor device 20. Namely, in the top view of the micro semiconductor structure, two of the upper portions 31 of the supporting layer 30 locate on one diagonal of the bottom surface 21 of the micro semiconductor device 20, and the other two upper portions 31 of the supporting layer 30 locate on another diagonal of the bottom surface 21 of the micro semiconductor device 20. As shown in FIG. 23, the bottom surface 21 of the micro semiconductor device 20 has four first regions 1, and the four first regions 1 is in direct contact with the vertices C1, C2, C3 and C4 of the bottom surface 21 respectively. Herein, since the four upper portions 31 of the supporting layer 30 contact the vertices C1, C2, C3 and C4 respectively, the weight of the micro semiconductor device 20 is shared by the plurality of the upper portions 31 of the supporting layer 30. Therefore, the micro semiconductor device 20 is held firmly by the supporting layer 30.

Figure 24:
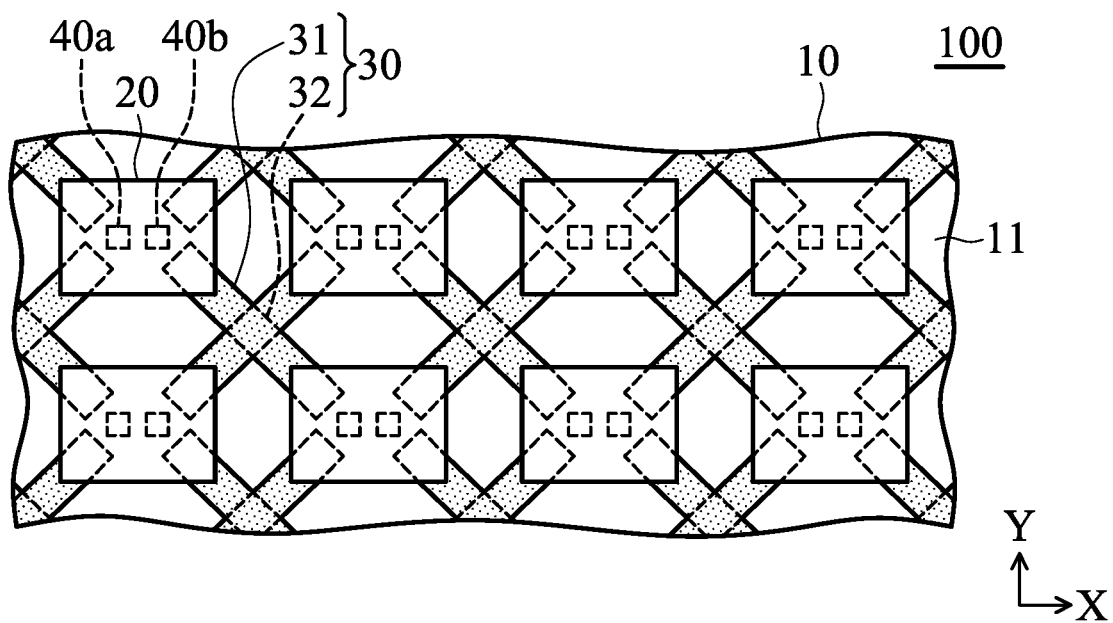
FIG. 24 is a top view of a micro semiconductor structure in accordance with one embodiment of the disclosure.
Figure 25:
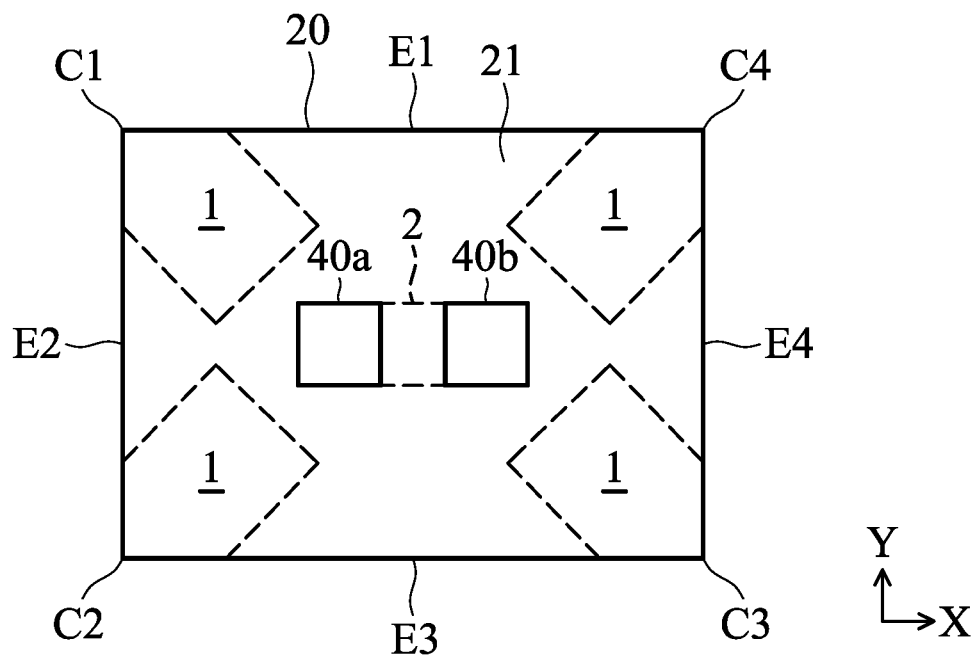
FIG. 25 is a bottom view of any one of the micro semiconductor devices of the micro semiconductor structure of FIG. 24.

FIG. 24 is a top view of a micro semiconductor structure 100 in accordance with another embodiment of the disclosure, and FIG. 25 is a bottom view of any one of the micro semiconductor devices 20 of the micro semiconductor structure 100 of FIG. 24. The supporting layer 30 and the substrate 10 are not shown in FIG. 25 for convenience of illustration. According to embodiments of the disclosure, besides rectangle (as shown in FIG. 22), the orthogonal projection of the upper portion 31 of the supporting layer 30 onto the substrate 10 can be X-shaped configuration. As shown in FIGS. 24 and 25, the micro semiconductor device 20 contacts four upper portion 31 of the supporting layer 30, and the four upper portion 31 of the supporting layer 30 cover and directly contact the vertices C1, C2, C3 and C4 of the bottom surface 21 of the micro semiconductor device 20 respectively. Namely, in the top view of the micro semiconductor structure, two of the upper portions 31 of the supporting layer 30 locate on one diagonal of the bottom surface 21 of the micro semiconductor device 20, and the other two upper portions 31 of the supporting layer 30 locate on another diagonal of the bottom surface 21 of the micro semiconductor device 20. As shown in FIG. 25, the bottom surface 21 of the micro semiconductor device 20 has four first regions 1, and the four first regions 1 is in direct contact with the vertices C1, C2, C3 and C4 of the bottom surface 21 respectively.

According to embodiments of the disclosure, the micro semiconductor device 20 can be subsequently transferred, integrated and assembled into a variety of illumination or display applications, such as a micro LED display. The micro LED display can include other components depending on its application. These other components include (but are not limited to) memory, touch panel controllers, and batteries. In other embodiments, the micro LED display can be a television, tablet computer, cell phone, laptop computer, computer monitor, stand-alone terminal server, digital camera, handheld game console, media display, electronics book display, car display or large area electronic board display.

In addition, compared with the general LED technology, the dimension of the micro semiconductor device 20 is reduced from the millimeter level to the micron level, and therefore the micro semiconductor device 20 of the disclosure is transferred, integrated and assembled to obtain a micro LED display. The resulted micro LED display can achieve high resolution and reduce the power consumption of display, and therefore, it has advantages of energy-saving, simple mechanism, thin and so on.

In summary, the micro semiconductor structure of the disclosure has the supporting layer disposed between the substrate and the micro semiconductor device. By means of the supporting layer, the micro semiconductor device can be elevated and held. The micro semiconductor devices are spaced apart from each other by a predetermined distance. As a result, the specific micro semiconductor structure can prevent the micro semiconductor devices from being damaged during the subsequent transferring process. In addition, in the micro semiconductor structure of the disclosure, the supporting layer is disposed on the bottom surface of the micro semiconductor device, rather than sidewalls of the micro semiconductor device. As a result, the amount of the micro semiconductor devices disposed on the temporary carrier can be increased on the premise that the success rate of the process for transporting and transferring the micro semiconductor devices is not reduced.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A micro semiconductor structure, comprises:
   a substrate;
   at least one supporting layer disposed on a top surface of the substrate, wherein the supporting layer consists of at least one upper portion and a bottom portion, and wherein the upper portion extends in a first direction, and the length of the upper portion in the first direction (L1) is longer than the length of the bottom portion in the first direction (L2); and
   at least one micro semiconductor device, wherein the micro semiconductor device has a first electrode and a second electrode, wherein the first electrode and the second electrode are disposed on a bottom surface of the micro semiconductor device, or the first electrode is disposed on the bottom surface of the micro semiconductor device and the second electrode is disposed on a top surface of the micro semiconductor device, and wherein the bottom surface of the micro semiconductor device directly contacts the upper portion of the supporting layer.

2. The micro semiconductor structure as claimed in claim 1, wherein the ratio (L2/L1) of the length of the bottom portion in the first direction (L2) to the length of the upper portion in the first direction (L1) is greater than or equal to 0.05, and less than or equal to 0.5.

3. The micro semiconductor structure as claimed in claim 1, wherein the bottom surface of the micro semiconductor device has at least one first region which is an interface between the bottom surface of the micro semiconductor device and the upper portion of the supporting layer, and the ratio (A1/A2) of the surface area of the first region (A1) to the surface area of the bottom surface of the micro semiconductor device (A2) is greater than or equal to 0.05, and less than or equal to 0.5.

4. The micro semiconductor structure as claimed in claim 3, wherein the first region has a length in the first direction (L3) and there is a minimum distance between the first region and the bottom portion of the supporting layer in the first direction (D1), and wherein the ratio (L3/(L3+D1)) of the length of the first region in the first direction (L3) to a sum of the length of the first region in the first direction (L3) and the minimum distance (D1) is greater than or equal to 0.2, and less than or equal to 0.8.

5. The micro semiconductor structure as claimed in claim 4, wherein the first region in the first direction (L3) is less than or equal to 5 μm, and the minimum distance (D1) is less than or equal to 25 μm.

6. The micro semiconductor structure as claimed in claim 3, wherein the bottom surface of the micro semiconductor device has at least two first regions, wherein the at least two first regions are spaced apart from each other.

7. The micro semiconductor structure as claimed in claim 1, wherein the supporting layer comprises at least two upper portions disposed on the bottom portion, and the upper portions are spaced apart from each other.

8. The micro semiconductor structure as claimed in claim 1, wherein the first electrode has a thickness T1, the second electrode has a thickness T2, and the upper portion of the supporting layer has a thickness T3, and wherein the thickness T1 of the first electrode is greater than the thickness T3 of the upper portion of the supporting layer.

9. The micro semiconductor structure as claimed in claim 8, wherein the thickness T2 of the second electrode is greater than the thickness T3 of the upper portion of the supporting layer, when the second electrode is disposed on the bottom surface of the micro semiconductor device.

10. The micro semiconductor structure as claimed in claim 8, wherein the bottom portion of the supporting layer has a thickness T4, and a sum (T3+T4) of the thickness T3 of the upper portion and the thickness T4 of the bottom portion is greater than the thickness T1 of the first electrode.

11. The micro semiconductor structure as claimed in claim 10, wherein the sum (T3+T4) of the thickness T3 of the upper portion and the thickness T4 of the bottom portion is greater than the thickness T2 of the second electrode, when the second electrode is disposed on the bottom surface of the micro semiconductor device.

12. The micro semiconductor structure as claimed in claim 1, wherein the upper portion of the supporting layer is made of a first material and the bottom portion of the supporting layer is made of a second material, wherein the first material is distinct from the second material, and the Young's modulus of the first material is less than the Young's modulus of the second material.

13. The micro semiconductor structure as claimed in claim 1, wherein an orthogonal projection of the bottom surface of the micro semiconductor device onto the substrate does not overlap an orthogonal projection of the bottom portion of the supporting layer onto the substrate.

14. The micro semiconductor structure as claimed in claim 1, wherein the first electrode and the second electrode do not come into direct contact with the supporting layer.

15. The micro semiconductor structure as claimed in claim 1, wherein the micro semiconductor device has a surrounding surface joining the top surface of the micro semiconductor device and the bottom surface of the micro semiconductor device, and wherein the supporting layer does not contact the top surface of the micro semiconductor device or the surrounding surface of the micro semiconductor device.

16. The micro semiconductor structure as claimed in claim 1, wherein the bottom surface of the micro semiconductor device has a second region disposed between the first electrode and the second electrode, and the second region does not directly contact the supporting layer, when the first electrode and the second electrode are disposed on the bottom surface of the micro semiconductor device.

17. The micro semiconductor structure as claimed in claim 1, wherein the upper portion of the supporting layer is entirely and directly above the bottom portion of the supporting layer, and a top of the bottom portion of the supporting layer extends from and is in contact with a bottom of the upper portion of the supporting layer.

* * * * *